United States Patent
Pan et al.

(10) Patent No.: US 9,093,656 B2
(45) Date of Patent: Jul. 28, 2015

(54) QUANTUM DOTS AND HOSTS

(75) Inventors: Junyou Pan, Frankfurt am Main (DE); Niels Schulte, Kelkheim (DE); Thomas Eberle, Landau (DE); Volker Hilarius, Gross-Umstadt (DE)

(73) Assignee: Merck Patent GmbH (DE)

( * ) Notice: Subject to any disclaimer, the term of this patent is extended or adjusted under 35 U.S.C. 154(b) by 0 days.

(21) Appl. No.: 13/811,963

(22) PCT Filed: Jun. 28, 2011

(86) PCT No.: PCT/EP2011/003167
§ 371 (c)(1),
(2), (4) Date: Mar. 20, 2013

(87) PCT Pub. No.: WO2012/013272
PCT Pub. Date: Feb. 2, 2012

(65) Prior Publication Data
US 2013/0214249 A1    Aug. 22, 2013

(30) Foreign Application Priority Data
Jul. 26, 2010    (EP) .................... 10007743

(51) Int. Cl.
*H01L 51/50*    (2006.01)
*H01L 51/00*    (2006.01)
*B82Y 20/00*    (2011.01)

(52) U.S. Cl.
CPC ............ *H01L 51/50* (2013.01); *H01L 51/5012* (2013.01); *H01L 51/5088* (2013.01); *B82Y 20/00* (2013.01); *H01L 51/0035* (2013.01); *H01L 51/0043* (2013.01); *Y10S 977/774* (2013.01); *Y10S 977/95* (2013.01)

(58) Field of Classification Search
CPC ........ H01L 27/28; H01L 27/288; H01L 51/50; H01L 51/5088
See application file for complete search history.

(56) References Cited

U.S. PATENT DOCUMENTS

2009/0255580 A1*   10/2009   Dasgupta et al. ............. 136/256
2010/0237323 A1    9/2010    Akai et al.

FOREIGN PATENT DOCUMENTS

| JP | 2009099545 A | 5/2009 |
| JP | 2010-141059 A | 6/2010 |
| WO | WO-2005055330 A1 | 6/2005 |

OTHER PUBLICATIONS

Torriss, Badr, et al., "White Light-Emitting Organic Device with Electroluminescent Quantum Dots and Organic Molecules", Organic Electronics, vol. 10, (2009), pp. 1454-1458.
Choudhury, Kaushik Roy, et al., "Efficient Solution-Processed Hybrid Polymer-Nanocrystal Near Infrared Light-Emitting Devices", Organic Electronics, vol. 11, (2010), pp. 23-28.
International Search Report for PCT/EP2011/003167 mailed Jul. 28, 2011.

* cited by examiner

*Primary Examiner* — Whitney T Moore
(74) *Attorney, Agent, or Firm* — Drinker Biddle & Reath LLP

(57) ABSTRACT

An electronic device comprising a quantum dot and an organic host, a mixture comprising a quantum dot and an organic host, a quantum dot, a method for preparing a quantum dot (QD), and a formulation including the mixture or the quantum dot are provided.

22 Claims, 3 Drawing Sheets

QUANTUM DOTS AND HOSTS

CROSS-REFERENCE TO RELATED APPLICATIONS

This application is a national stage application (under 35 U.S.C. §371) of PCT/EP2011/003167, filed Jun. 28, 2011, which claims benefit of European Application 10007743.7, filed Jul. 26, 2010.

BACKGROUND OF THE INVENTION

The present invention is directed to an electronic device comprising a quantum dot and an organic host, a mixture comprising a quantum dot and an organic host, a quantum dot, a method for preparing a quantum dot (QD), and a formulation including the mixture or the quantum dot.

Organic light emitting diodes (OLEDs) as promising next generation display technology have drawn considerable attention since more than two decades, because OLED materials are versatility in synthesis, rich in color, light in weight, and less power consumption. The performance of OLEDs, especially those based on evaporated small molecules, has shown excellent performance, like color, lifetime and driving voltage, allowing OLEDs to enter commercial applications.

In OLED devices, electrons and holes are injected from opposite electrodes and recombine to form excitons, either singlet or triplet. Radiative decay from singlet excitons is fast (fluorescence), but that from triplet excitons (phosphorescence) is inhibited by the requirement of spin conservation and is therefore often inefficient. According to quantum statistics, three triplets per singlets are formed in the OLED if the probability of exciton formation is not spin-dependent. The probability of singlet exciton formation for devices based on fluorescent materials is thus only 25%. Hence, a fundamental limit of an internal quantum efficiency of 25% is put on OLEDs which are solely based on singlet emitters. This limit can be overcome by incorporating phosphorescent dopants, also called triplet emitters, usually complexes containing a heavy metal, which can increase spin-orbital coupling and harvest both singlet and triplet excitons. However, the metal complex is difficult to synthesize and it has stability problems. So far, a stable (deep) blue triplet emitter is still elusive. Moreover, because the triplet level of the organic materials is typically at least 0.5 eV higher than singlet level, a blue triplet emitter having itself a big band-gap (or HOMO-LUMO gap) will put extremely hard requirements on host materials and the charge transport materials in the adjacent layers.

On the other hand, another class of emissive material, so-called quantum dot or mono-dispersive nanocrystal as described below, has also drawn considerable attention in the last years. The advantages of quantum dot are: 1) theoretical internal quantum efficiency as high as 100%, compared to 25% of the singlet organic emitter; 2) soluble in common organic solvents; 3) emission wavelength can be easily tuned by the core size; 4) narrow emission spectrum; 5) intrinsic stability in inorganic materials.

The first mono-dispersive nanocrystals including a semiconducting material, also referred to herein as quantum dots or QDs, were based on CdE (E=S, Se, Te) and were produced using the so called TOPO (trioctyl phosphine oxide) method by Bawendi and later modified by Katari et al. A review on synthesis of QDs is given by Murray, Norris and Bawendi, "Synthesis and characterization of nearly monodisperse CdE (E=sulfur, selen, tellurium) semiconductor nanocrystallites", J. Am. Chem. Soc. 115[19], 8706-8715, 1993. The mostly-reported caps of quantum dots are based on trioctylphosphine oxide (TOPO) or trioctylphosphine (TOP), which are supposed to have electron transporting properties.

The first light-emitting diode based on CdSe QDs was reported by Alivisatos et al., "Light emitting diodes made from cadmium selenide nanocrystals and a semiconducting polymer", Nature (London) 370[6488], 354-357, 1994, where a multilayer consisting of QDs was sandwiched between PPV (poly(p-phenylene-vinylene)) and an electrode, giving emission in red upon applying voltage. Bulovic et al., "Electroluminescence from single monolayers of nanocrystals in molecular organic devices. Nature (London) 420[6917], 800-803, 2002 describe use of a single monolayer of CdSe QDs sandwiched between two organic layers.

But one major problem of known QD LEDs is the huge energy level offset between QDs and adjacent organic layers, for example CdSe QDs have a HOMO of −6.6 eV and LUMO of −4.4 eV (WO 2003/084292, WO 2007/095173), and on the other side functional organic materials have usually a LUMO >−3.0 eV and a HOMO >−5.6 eV. The big energy offset prevents that QDs are efficiently electronically active in electroluminescent devices or other electronic devices.

Therefore the object of the present invention is to provide an improved electronic device.

This can be realized by an electronic device according to claim 1, a mixture according to claim 9, and a quantum dot according to claim 15 of the present invention. The present invention further relates to a formulation including the mixture or the quantum dot, an application of the mixture or the quantum dot, a method for preparing the quantum dot, and the electronic device including the mixture or the quantum dot.

According to a first embodiment an electronic device includes a cathode, an anode, an emissive layer, a hole injection or charge generation layer deposited between the anode and the emissive layer, wherein the emissive layer includes at least one quantum dot and at least one host material.

In a variation of the first embodiment, an electronic device is provided, including a cathode, an anode, an emissive or active layer including at least one quantum dot and one organic host, and a charge generation layer deposited between the anode and the emissive layer.

Preferably the charge generation layer has a working function or electron affinity higher than 5.6 eV.

Typically, as mentioned before, the QDs available so far have a HOMO lower than −6.0 eV. However the standard transparent anode ITO (Indium Tin Oxide) used in OLED or QD-LED, has a working function of approximately −5.0 eV, and standard functional organic materials, especially hole injection materials (HIMs), have a HOMO>−5.6 eV. The huge offset in energy levels makes the hole injection from anode into QDs very difficult.

The present invention solves this problem by using a charge generation layer, which preferably has a work function or electron affinity higher than 5.6 eV, very preferably higher than 5.8 eV, and particularly preferably higher than 6.0 eV.

Orbital energies such as HOMO or LUMO as discussed within the present invention relate to distances from the vacuum level. If the distance of a molecular orbital energy level from the vacuum level is high, the orbital is said to be low or deep. In contrast, if the distance of a molecular orbital energy level is low, the orbital is said to be high.

Orbital energies (HOMO/LUMO) and band gaps can easily be determined according to methods well known in the art. These orbital levels may be measured by photoemission, e.g. X-ray photoelectron spectroscopy (XPS) and Ultra-violet photoelectron spectroscopy (UPS) or by cyclovoltammetry (CV) for oxidation and reduction, for instance. It is well understood in the field that the absolute energy levels are dependent of the method used, and even if the evaluation method for the same method, for example the onset point and peak point on the CV curved results in different values. Therefore, a reasonable comparison should be made by the same evaluation method of the same measurement method. More recently, quantum chemical calculations, for example Density Functional Theory (DFT), have become well-established methods to calculate the molecular orbitals, particularly occupied molecular orbitals. The method used herein in order to determine orbital energies and band gaps is outlined in Example 1. Preferably, the hole injection layer or charge generation layer is transparent, e.g. transparent for outcoupling light or incident light.

A hole injection layer or charge generation layer suitable for embodiments described herein can be selected from a charge generation layer or an intermediate connector layer for tandem OLEDs, as disclosed for example in U.S. Pat. No. 7,564,182 and US 2006/0240277A1.

According to one embodiment, in the electronic device the hole injection layer or charge generation layer is selected from or comprises one or more transition metal oxides. In a further embodiment, the hole injection layer is preferably selected from or comprise vanadium oxide ($VO_x$), molybdenum oxide ($MoO_x$), ruthenium oxide ($RuO_x$) and tungsten oxide ($WO_x$).

A BRIEF DESCRIPTION OF THE FIGURES

Figure 3:
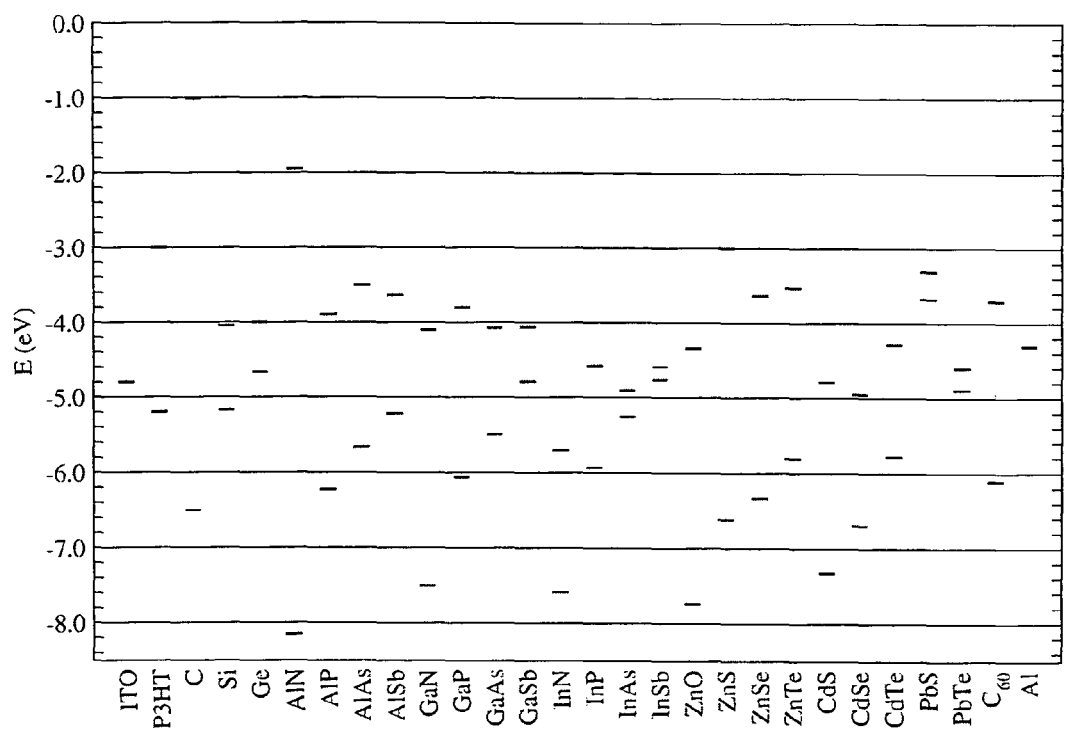

FIG. 3 Valence and conduction band edges of the common inorganic semiconductors in comparison with two organic semiconductors (P3HT and C60).

A DETAILED DESCRIPTION OF THE INVENTION

In a preferred embodiment, the charge generation layer is a single layer, including organic or inorganic compound. Preferably the charge generation layer is an inorganic layer, which may enable emissive layer being coated from solution on top of that. The suitable inorganic charge generation material can be selected from transition metal oxides (TMOs). Particularly preferred TMOs are those having a work function higher than 5.6 eV or more, such as vanadium oxide ($VO_x$), molybdenum oxide ($MoO_x$), ruthenium oxide ($RuO_x$) and tungsten oxide ($WO_x$). The use of $VO_x$, $MoO_x$, $RuO_x$ as hole injection layer in OLEDs can be referred to the reported by Tokito et al., in J. Phys. D: Appl. Phys. 29 (1996) 2750. And tungsten oxide ($WO_x$) as hole injection layer was reported for example by Hoping et al., in Appl. Phys. Lett. 92, 213306 (2008). The work function of the transition metal oxides can be measured by Kelvin-probe measurements, for example $WO_3$ has a work function 6.4 eV as reported in Appl. Phys. Lett. 91, 113506 (2007)) and, $MoO_3$ 6.7 eV as reported in (Appl. Phys. Lett. 95, 123301 (2009)).

A preferred device structure for inorganic charge generation layer has the following layer structure: substrate/anode/ hole injection layer (HIL) or charge generation layer (CGL)/ emissive layer (EML)/cathode. Optionally and also preferably, the device can further include an electron transport layer and/or buffer layer between EML and cathode, which may reduce the quenching from the cathode.

A further preferred suitable charge generation material can be selected from organic compounds having an electron affinity higher than higher than 5.6 eV or more. The suitable organic charge generation material can be selected from organic p-dopants, which are used for p-doping in OLEDs. For a general principle of n- and p-doping, and the related materials please refer to Chem. Rev., 2007, 107 (4), 1233-1271. The suitable organic p-dopant is for example, but not limited to, selected from p-dopants as described below.

A preferred device structure for organic charge generation layer has the following layer structure: substrate/cathode/ EML/HIL or CGL/anode. Optionally and also preferably, the device can further include an electron transport layer and/or buffer layer between EML and cathode, which may reduce the quenching from the cathode. This is because the organic p-dopants can usually be deposited by thermal vacuum evaporation.

A yet further suitable charge generation layer can be a photo-sensitive, particularly IR-sensitive charge generation layer.

According to one embodiment of the present invention, the active layer, particularly the emissive layer includes a quantum dot and an organic host material. To make high internal quantum efficiency (theoretical maximum of 100%) of quantum dot possible, it is highly desired that the exciton is formed directly on the quantum dot instead of on the organic host. This can be realised by using an active layer or emissive layer wherein either the ionisation potential (valence band or VB) of the said quantum dot is at least 0.3 eV higher than the HOMO of the organic host, or the electron affinity (conduction band or CB) of the quantum dot is at least 0.3 eV lower than the LUMO of the organic host.

The organic host has preferably a bigger band gap than the quantum dot.

The concentration of the QD is from 0.5 to 20 vol %, preferably from 1 to 15 vol %, very preferably from 2 to 10 vol %, and mostly preferably 2 to 5 vol %. In the most preferred embodiment, the concentration of the quantum dot is so adjusted that it works as hole trap or electron trap in the organic host.

In one preferred embodiment, the quantum dot has an electron affinity at least 0.3 eV, more preferably 0.4 eV, very preferably 0.5 eV lower that the LUMO of the organic host. In this embodiment, the quantum dot works as electron trap or deep electron trap.

It is desired to use the available standard quantum dots, which have usually deep HOMO and deep LUMO as mentioned before. The suitable organic host should also have either deep HOMO or deep LUMO or both. In one preferred embodiment, the organic host has a LUMO lower than −3.0 eV, more preferably lower than −3.5 eV, and particularly preferably lower than −4.0 eV. In another preferred embodiment, the organic host has a HOMO lower than −5.7 eV, more preferably lower than −6.0 eV, and particularly preferably lower than −6.2 eV.

The deep HOMO or deep LUMO organic host can be selected from compounds including strong electron-withdrawing group(s), which can be preferably selected from halogen, nitrile, carbonyl and nitro groups, for example —F, —CN, —CO, and —$NO_2$.

The deep HOMO or deep LUMO organic host can be selected from a small molecule, an oligomer, a polymer and dendrimer, or a combination thereof.

The term small molecule as used herein is defined as molecule not being a polymer, oligomer, dendrimer, or a blend. In particular, repeating structures are absent in small molecules. The molecular weight of small molecules is typically in the range of polymers with a low number of repeating units, oligomers or less.

The molecular weight of the small molecule is preferably below 4000 g/mol, particularly preferably below 3000 g/mol, and very particularly preferably below 2000/mol.

The polymers of the present invention preferably have 10 to 10000, particularly preferably 20 to 5000 and very particularly preferably 50 to 2000 repeat units. Oligomers according to this invention have preferably 2 to 9 repeat units. The branching index of the polymers and oligomers is between 0 (linear polymer without branching) and 1 (completely branched dendrimer). The term dendrimer as used herein is defined according to M. Fischer et al. in Angew. Chem., Int. Ed. 1999, 38, 885).

The molecular weight (MW) of the polymers of the present invention is preferably in the range of 10000 to 2000000 g/mol, particularly preferably in the range of 100000 to 1500000 g/mol, and very particularly preferably in the range of 200000 to 1000000 g/mol. The determination of MW can be performed according to standard techniques known to the person skilled in the art by employing gel permeation chromatography (GPC) with polystyrene as internal standard, for instance.

A blend is a mixture comprising at least one polymeric dendrimeric, or oligomeric component.

For the purposes of the present invention, an alkyl group having 1 to 40 C atoms, in which, in addition, individual H atoms or $CH_2$ groups may be substituted by $-R^2C=CR^2-$, $-C\equiv C-$, $Si(R^2)_2$, $Ge(R^2)_2$, $Sn(R^2)_2$, $C=O$, $C=S$, $C=Se$, $C=NR^2$, $-O-$, $-S-$, $-COO-$ or $-CONR^2-$, is preferably taken to mean the radicals methyl, ethyl, n-propyl, i-propyl, n-butyl, i-butyl, s-butyl, t-butyl, 2-methylbutyl, n-pentyl, s-pentyl, neopentyl, cyclopentyl, n-hexyl, neohexyl, cyclohexyl, n-heptyl, cycloheptyl, n-octyl, cyclooctyl, 2-ethyl-hexyl, trifluoromethyl, pentafluoroethyl and 2,2,2-trifluoroethyl. For the purposes of this invention, an alkenyl group is taken to mean, in particular, ethenyl, propenyl, butenyl, pentenyl, cyclopentenyl, hexenyl, cyclohexenyl, heptenyl, cycloheptenyl, octenyl and cyclooctenyl. For the purposes of this invention, an alkynyl group is taken to mean, in particular, ethynyl, propynyl, butynyl, pentynyl, hexynyl or octynyl. A $C_1$- to $C_{40}$-alkoxy group is preferably taken to mean methoxy, tri-fluoromethoxy, ethoxy, n-propoxy, i-propoxy, n-butoxy, i-butoxy, s-butoxy, t-butoxy or 2-methylbutoxy.

For the purposes of this invention, an aromatic ring system contains 6 to 60 C atoms, preferably 6 to 40 C atoms, more preferably 6 to 24 C atoms, in the ring system. For the purposes of this invention, a heteroaromatic ring system contains 1 to 79 C atoms and at least one heteroatom in the ring system, more preferably 2 to 40 C atoms and at least one heteroatom, most preferably 2 to 24 C atoms and at least one heteroatom, with the proviso that the sum of C atoms and heteroatoms is at least 5. The heteroatoms are preferably selected from N, O and/or S. For the purposes of this invention, an aromatic or heteroaromatic ring system is, in addition, intended to be taken to mean a system which does not necessarily contain only aryl or heteroaryl groups, but instead in which a plurality of aryl or heteroaryl groups may also be connected by a non-aromatic unit (preferably less than 10% of the atoms other than H), such as, for example, a C, N or O atom. Thus, for example, systems such as 9,9'-spirobifluorene, 9,9-diarylfluorene, triarylamine, diaryl ether, stilbene, etc. are also intended to be taken to be aromatic ring systems for the purposes of this invention, as are systems in which two or more aryl groups are connected, for example, by a linear or cyclic alkyl group or by a silyl group, and likewise biaryl or oligoaryl groups.

An aromatic or heteroaromatic ring system having 5-60 ring atoms, which may also in each case be substituted by the above-mentioned radicals R and which may be linked to the aromatic or heteroaromatic ring system via any desired positions, is taken to mean, in particular, groups derived from benzene, naphthalene, anthracene, phenanthrene, pyrene, chrysene, benzanthracene, perylene, fluoranthene, naphthacene, pentacene, benzo-pyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothio-phene, isobenzothiophene, dibenzothiophene, pyrrole, indole, isoindole, carbazole, cis- or trans-indenocarbazole, cis- or trans-indolocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimi-dazole, oxazole, benzoxazole, naphthoxazole, anthroxazole, phenanthrox-azole, isoxazole, 1,2-thiazole, 1,3-thiazole, benzothiazole, pyridazine, benzopyridazine, pyrimidine, benzopyrimidine, quinoxaline, 1,5-diaza-anthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole, or combinations of these groups.

In a preferred embodiment, the organic host is a copolymer, and more preferably a conjugated copolymer, which includes at least one repeating unit, which has a deep HOMO or a deep LUMO or both.

A preferred repeating unit for a copolymer is of formulae (1) and (2) as disclosed for example in WO 2005/033174 A1:

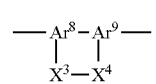

Formula (1)

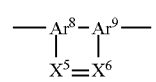

Formula (2)

wherein
$Ar^8$ and $Ar^9$ independently of each other denote a trivalent aromatic hydrocarbon group or a trivalent heterocyclic group,
$X^3$ and $X^4$ independently of each other denote O, S, C(=O), S(=O), $SO_2$, $C(R^1)(R^2)$, $Si(R^1)(R^2)$, $N(R^1)$, $B(R^1)$, $P(R^1)$ or $P(=O)(R^1)$,
$X^5$ and $X^6$ independently of each other denote N, B, P, $C(R^1)$ or $Si(R^1)$,
$R^1$ and $R^2$ are independently of each other identical or different groups selected from H, halogen, $-CN$, $-NC$, $-NCO$, $-NCS$, $-OCN$, $-SCN$, $-C(=O)NR^0R^{00}$, $-C(=O)X$, $-C(=O)R^0$, $-NH_2$, $-NR^0R^{00}$, $-SH$, $-SR^0$, $-SO_3H$, $-SO_2R^0$, $-OH$, $-NO_2$, $-CF_3$, $-SF_5$, optionally substituted silyl, or carbyl or hydrocarbyl with 1 to 40 C atoms that is optionally substituted and optionally includes one or more hetero atoms, and optionally the groups $R^1$ and $R^2$ form a spiro group with the fluorene moiety to which they are attached, X is halogen, $R^0$ and $R^{00}$ are independently of each other H or an optionally substituted carbyl or hydrocarbyl group optionally including one or more hetero atoms, and wherein $X^3$ and $Ar^9$ are bonded to adjacent carbon atoms in the aromatic ring of $Ar^9$, $X^4$ and $Ar^8$ are bonded to adjacent carbon atoms in the aromatic ring of $Ar^9$, $X^5$ and $Ar^9$ are bonded to adjacent atoms in the aromatic ring of $Ar^8$, and $X^6$ and $Ar^8$ are bonded to adjacent atoms in the aromatic ring of $Ar^9$.

The repeating unit of formula (1) has preferably of the following subformula:

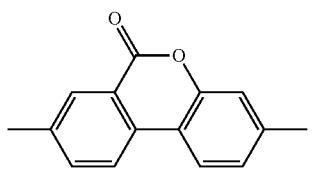

Another preferred repeating unit for copolymer is of formula (3) as disclosed for example in WO2003/099901A1:

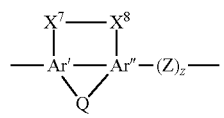

Formula (3)

wherein

Ar' and Ar" denote an aromatic hydrocarbon group or heterocyclic group;

one of $X^7$ and $X^8$ denotes C(=O) or C($R^1$)($R^2$) and the other denotes O, S, C(=O), S(=O), $SO_2$, C($R^1$)($R^2$), Si($R^1$)($R^2$), N($R^1$), B($R^1$), P($R^1$) or P(=O)($R^1$), Q is $X^9$, $X^9$—$X^{10}$ or $X^{11}$=$X^{12}$, $X^9$ and $X^{10}$ denote independently of each other O, S, C(=O), S(=O), $SO_2$, C($R^1$)($R^2$), Si($R^1$)($R^2$), N($R^1$), B($R^1$), P($R^1$) or P(=O)($R^1$), $X^{11}$ and $X^{12}$ denote independently of each other N, B, P, C($R^1$) or Si($R^1$), Z denotes —$CR^1$=$CR^2$— or —C≡C—, z is 0 or 1, $R^1$ is as defined above, $R^2$ is as defined above.

The repeating unit of formula (3) is preferably selected from the following subformulae:

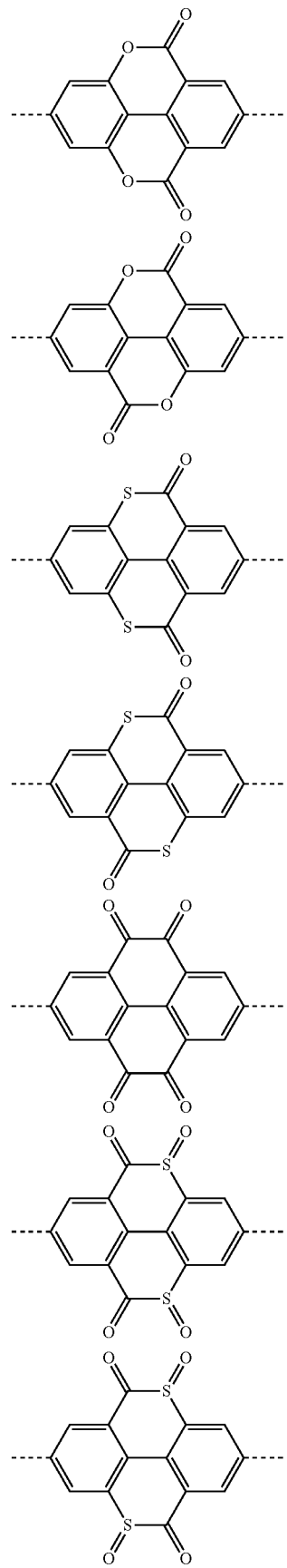

-continued

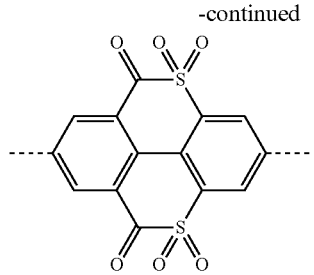

A preferred repeating unit for copolymer is of formula (4), as disclosed for example in DE 102006003710.3:

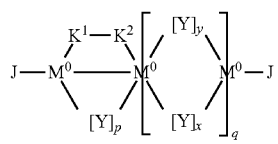

Formula (4)

wherein $M^0$ is in case of multiple occurrence independently of one another an aromatic, heteroaromatic or non-aromatic ring system having 2 to 40 C atoms, which is unsubstituted or substituted with one or more identical or different groups R, $K^{1,2}$ and Y are in case of multiple occurrence independently of one another a bridging group forming a cyclic system with M, selected from $B(R^1)$, $C(R^1)_2$, $Si(R^1)_2$, C=O, C=S, C=Se, C=Te, C=NR$^1$, C=C(R$^1$)$_2$, O, S, S=O, SO$_2$, S(R$^1$)$_2$, N(R$^1$), P(R$^1$), P(=O)R$^1$, P(=S)R$^1$, C≡C or a combination or one, two, three or four of these groups, J is a linkage group to the polymer, and may also be a substituted or unsubstituted C—C-double or triple bond, a substituted aromatic or heteroaromatic or non-aromatic cyclic ring system having 2 to 40 C atoms, which is unsubstituted or substituted with one or more identical or different groups $R^1$, $R^1$ is as defined in formula I, x, y, p are in case of multiple occurrence independently of one another 0 or 1, with the proviso that at least one of x and y is 1, q is an integer ≥1.

The repeating unit of formula (4) is preferably selected from the following subformulae:

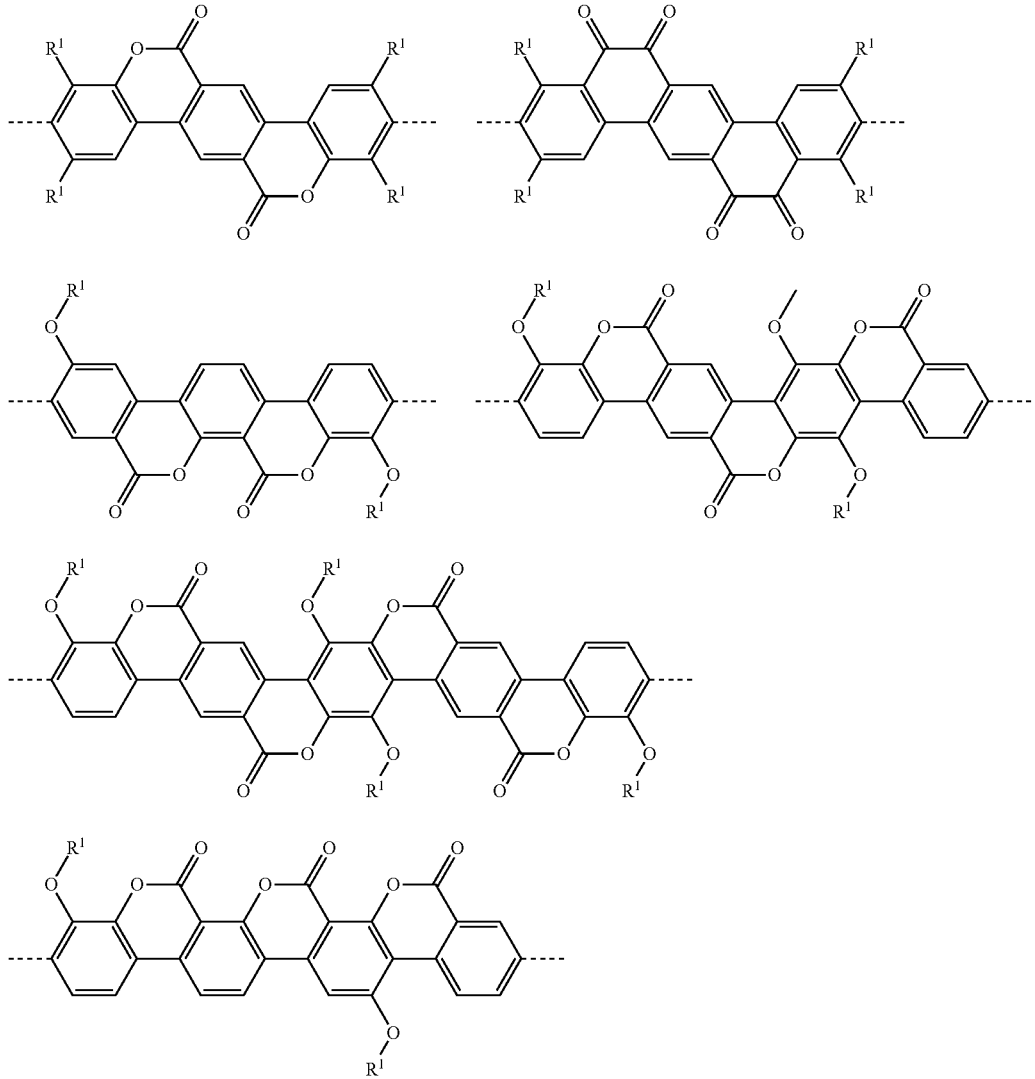

-continued

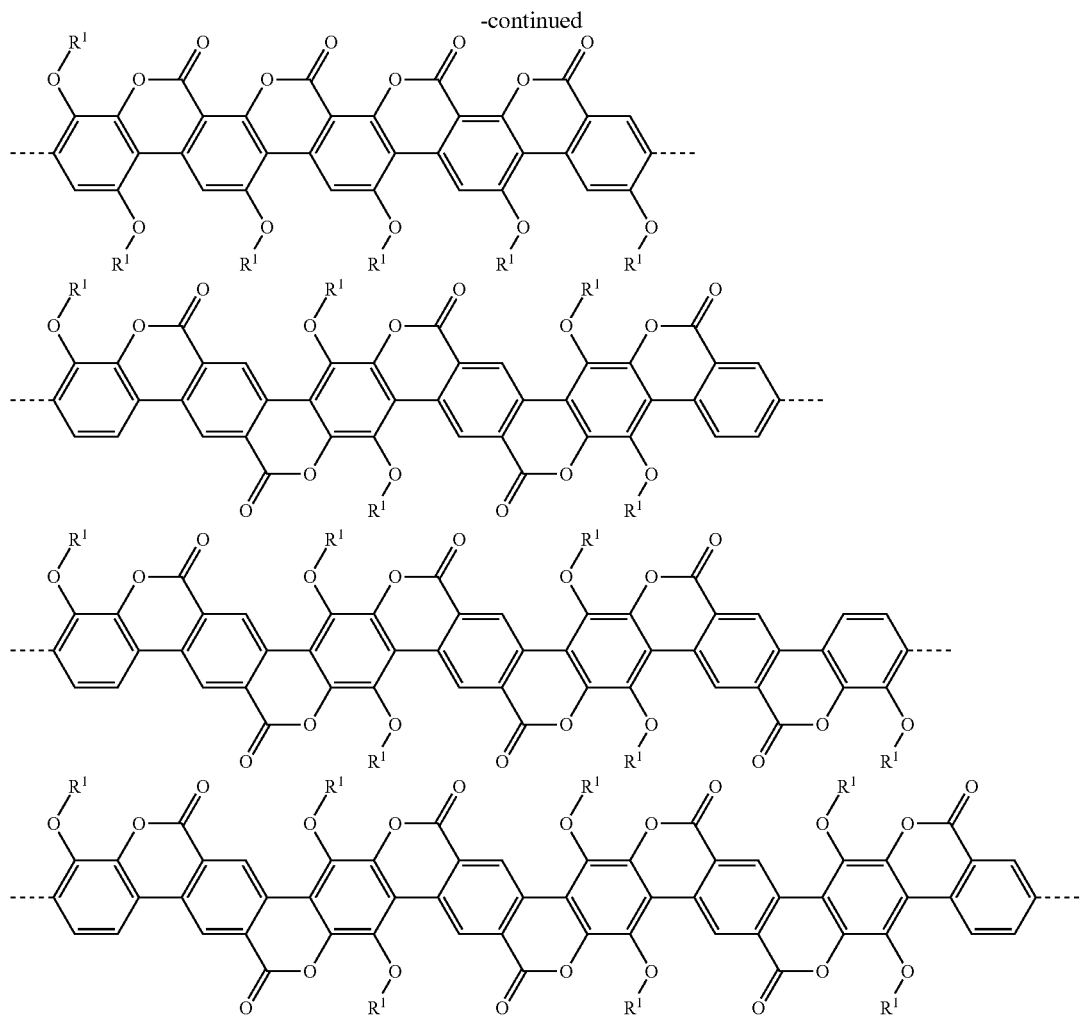

wherein $R^1$ is defined as above.

In general, a quantum dot is a semiconductor whose excitons are confined in all three spatial dimensions. As a result, they have properties that are between those of bulk semiconductors and those of discrete molecules.

There are several ways to make quantum dot structures, for example by chemical methods or by ion implantation, or in nanodevices made by state-of-the-art lithographic techniques.

The quantum dots (QDs) of the present invention refer to colloidal semiconductor nanocrystals, also known as colloidal quantum dots, or nanodots or nanocrystals, which are produced by chemical methods.

While any method known to the skilled person can be used to create QDs, preferably, a solution-phase colloidal method for controlled growth of inorganic QDs is used. The colloidal methods can be referred to, e.g., Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," J. Am. Chem. Soc. 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," J. Am. Chem. Soc. 115:8706 (1993). These methods allow low cost processability without the need for clean rooms and expensive manufacturing equipment. In these methods, metal precursors that undergo pyrolysis at high temperature are rapidly injected into a hot solution of organic surfactant molecules. These precursors break apart at high temperatures and react to nucleate nanocrystals. After this initial nucleation phase, a growth phase begins by the addition of monomers to the growing crystal. The result is crystalline nanoparticles in solution that have an organic surfactant molecule coating their surface.

In these methods, synthesis occurs as an initial nucleation event that takes place over seconds, followed by crystal growth at elevated temperature for several minutes. Parameters such as the temperature, types of surfactants present, precursor materials, and ratios of surfactants to monomers can be modified so as to change the nature and progress of the reaction. The temperature controls the structural phase of the nucleation event, rate of decomposition of precursors, and rate of growth. The organic surfactant molecules mediate both solubility and control of the nanocrystal shape. The ratio of surfactants to monomer, surfactants to each other, monomers to each other, and the individual concentrations of monomers strongly influence the kinetics of growth.

Suitable semiconducting materials, which can be incorporated into QDs, are selected from elements of Group II-VI, such as CdSe, CdS, CdTe, ZnSe, ZnO, ZnS, ZnTe, HgS, HgSe, HgTe and alloys thereof such as CdZnSe; Group III-V, such as InAs, InP, GaAs, GaP, InN, GaN, InSb, GaSb, AlP, AlAs, AlSb and alloys such as InAsP, CdSeTe, ZnCdSe, InGaAs; Group IV-VI, such as PbSe, PbTe and PbS and alloys thereof; Group III-VI, such as InSe, InTe, InS, GaSe and alloys such as InGaSe, InSeS; Group IV semiconductors, such as Si and Ge alloys thereof, and combinations thereof in composite structures.

Further suitable semiconductor materials include those disclosed in U.S. patent application Ser. No. 10/796,832 and include any type of semiconductor, including group II-VI, group III-V, group IV-VI and group IV semiconductors. Suitable semiconductor materials include, but are not limited to, Si, Ge, Sn, Se, Te, B, C (including diamond), P, BN, BP, BAs, AlN, AlP, AlAs, AlS, AlSb, BaS, BaSe, BaTe, CaS, CaSe, CaTe, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, and an appropriate combination of two or more such semiconductors.

In some embodiments, the QDs may include a dopant from the group consisting of: a p-type dopant or an n-type dopant. The properties and synthesis of a doped QD can be referred to "n-type colloidal semiconductor nanocrystals" by Moonsub Shim & Philippe Guyot-Sionnest, Nature vol 407 (2000) p 981, and "Doped Nanocrystals" by Norris et al., Science, 319 (2008), p 1776. The QDs the present invention can also include II-VI or III-V semiconductors. Examples of II-VI or III-V semiconductor nanocrystals include any combination of an element from Group II, such as Zn, Cd and Hg, with any element from Group VI, such as S, Se, Te, Po, of the Periodic Table; and any combination of an element from Group III, such as B, Al, Ga, In, and Tl, with any element from Group V, such as N, P, As, Sb and Bi, of the Periodic Table.

In quantum dots, photoluminescence and electroluminescence arise from the band edge states of the nanocrystal. The radiative band-edge emission from nanocrystals competes with non-radiative decay channel originating from surface electronic states, as reported by X. Peng, et al., J. Am. Chem. Soc. Vol 119:7019-7029 (1997). Thus, the presence of surface defects such as dangling bonds provide non-radiative recombination centers and lower emission efficiency. An efficient method to passivate and remove the surface trap states is to epitaxially grow an inorganic shell material on the surface of the nanocrystal, as disclosed by X. Peng, et al., J. Am. Chem. Soc. Vol 119:7019-7029 (1997). The shell material can be chosen such that the electronic levels are type I with respect to the core material (e.g., with a larger bandgap to provide a potential step localizing the electron and hole to the core). As a result, the probability of non-radiative recombination can be reduced.

Core-shell structures are obtained by adding organometallic precursors containing the shell materials to a reaction mixture containing the core nanocrystal. In this case, rather than a nucleation-event followed by growth, the cores act as the nuclei, and the shells grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and ensure solubility. A uniform and epitaxially grown shell is obtained when there is a low lattice mismatch between the two materials. Additionally, the spherical shape acts to minimize interfacial strain energy from the large radius of curvature, thereby preventing the formation of dislocations that could degrade the optical properties of the nanocrystal system.

In a preferred embodiment, ZnS can be used as the shell material using known synthetic processes.

In a particularly preferred embodiment, the QD of the invention includes semiconducting materials selected from Group II-VI semiconductors, alloys thereof and core/shell structures made there from. In further embodiments, the Group II-VI semiconductors are CdSe, CdS, CdTe, ZnSe, ZnS, ZnTe, alloys thereof, combinations thereof and core/shell, core multi-shell layered-structures thereof.

In some embodiments, the QDs of the present invention include further ligands conjugated, cooperated, associated or attached to their surface. Suitable ligands include any group known to those skilled in the art, including those disclosed in U.S. patent application Ser. No. 10/656,910 and U.S. Provisional Patent Application No. 60/578,236. Use of such ligands can enhance the ability of the QDs to incorporate into various solvents and matrix materials, including polymers. Further preferred ligands are such having a "head-body-tail" structure, as disclosed in US2007/0034833A1, wherein further preferably the "body" has an electron or hole transport function, as disclosed in US20050109989A1.

The term quantum dots (QDs) refers to nanocrystals that are substantially mono-dispersive in size. A QD has at least one region or characteristic dimension with a dimension of less than about 500 nm, and down to on the order of less than about 1 nm. The term mono-dispersive means the size distribution is within +−10% of the stated value, for example a mono-dispersive nanocrystals of 100 nm in diameter encompasses a range of sizes from 90 nm or larger to 110 nm or smaller.

Due to the finite size of the QDs, especially core-shell QDs, they display unique optical properties compared to their bulk counterparts. The emission spectrum is defined by a single Gaussian peak, which arises from the band-edge luminescence. The emission peak location is determined by the core particle size as a direct result of quantum confinement effects. The electronic & optical properties are discussed by Al. L. Efros and M. Rosen in Annu. Rev. Mater. Sci. 2000. 30:475-521.

It is also highly desired to use an organic host suitable and/or available for OLEDs, which has a shallow HOMO.

In another preferred embodiment, the quantum dot has an ionisation potential at least 0.3 eV, more preferably 0.4 eV, very preferably 0.5 eV higher that the HOMO of the organic host.

In this preferred embodiment, the quantum dot is preferably selected from those having a valence band or HOMO, also referred to herein as VB, higher than −5.7 eV, more preferably higher than −5.5 eV, and very preferably higher than −5.3 eV. A quantum dot suitable for this embodiment, also called hereafter as shallow VB quantum dot, may be obtained in tow different ways.

In another preferred embodiment, the shallow VB quantum dot comprises a semiconductor element(s), which has a valence band higher than −5.7 eV (relative to vacuum level). FIG. 3 shows the valence and conduction band edges of some common inorganic semiconductors. Accordingly, the suitable semiconductors can be selected from Si, Ge, GaP, GaInP, GaAs, InGaAs, AlAs, AlSb, InAs, GaSb, InSb, ZnTe, CdTe and the alloys thereof. Further preferably, the said shallow VB quantum dot has a core-shell structure, wherein the shell comprises a semiconductor element(s), which has a valence band higher than −5.7 eV (relative to vacuum level).

In yet another preferred embodiment, the shallow VB quantum dot comprises an organic ligand, which has a HOMO higher than −5.7 eV, more preferably higher than −5.5 eV, and very preferably higher than −5.3 eV.

The HOMO of the quantum dot can be changed by surface fictionalisation with redox-active molecules, for example a Ferrocene-coated Cd/ZnS core-shell quantum dot as reported by Denis Dorokhin, et al, in Nanotechnology (10), 21, p 285703, and a tetraaniline coated CdSe quantum dot as reported by Querner et al in Phys. Chem. Chem. Phys. (05), 7, p 3204.

The suitable ligand for this embodiment can be selected according to the general formula (5):

D-B-A  Formula (5)

Wherein A is an anchor group, which anchors on the QD surface, for example thiol group; and B a spacer, preferably selected from alkyl, alkoxy group; and D an organic function group, which has a HOMO higher than −5.7 eV, more preferably higher than −5.5 eV, and very preferably higher than −5.3 eV.

Preferably, the suitable D can be selected from the host and/or matrix compounds as described bellow.

Very preferably, the suitable D is selected from hole transport materials (HTMs).

In principle any HTM known to one skilled in the field of OLEDs can be employed in ligand according to embodiments described herein. Further to HTM mentioned elsewhere herein, HTM may be chosen from amines, triarylamines, thiophenes, carbazoles, phthalocyanines, porphyrines, isomers and derivatives thereof. HTM may be particularly chosen from amines, triarylamines, thiophenes, carbazoles, phthalocyanines, and porphyrines.

Suitable materials for hole-transporting layers are phenylenediamine derivatives (U.S. Pat. No. 3,615,404), arylamine derivatives (U.S. Pat. No. 3,567,450), amino-substituted chalcone derivatives (U.S. Pat. No. 3,526,501), styrylanthracene derivatives (JP A 56-46234), polycyclic aromatic compounds (EP 1009041), polyarylalkane derivatives (U.S. Pat. No. 3,615,402), fluorenone derivatives (JP A 54-110837), hydrazone derivatives (U.S. Pat. No. 3,717,462), stilbene derivatives (JP A 61-210363), silazane derivatives (U.S. Pat. No. 4,950,950), polysilanes (JP A 2-204996), aniline copolymers (JP A 2-282263), thiophene oligomers, polythiophenes, PVK, polypyrroles, polyanilines and further copolymers, porphyrin compounds (JP A 63-2956965), aromatic dimethylidene-type compounds, carbazole compounds, such as, for example, CDBP, CBP, mCP, aromatic tertiary amine and styrylamine compounds (U.S. Pat. No. 4,127,412), and monomeric triarylamines (U.S. Pat. No. 3,180,730). Even more triarylamino groups may also be present in the molecule.

Preference may be given to aromatic tertiary amines containing at least two tertiary amine units (U.S. Pat. No. 4,720,432 and U.S. Pat. No. 5,061,569), such as, for example, 4,4'-bis[N-(1-naphthyl)-N-phenylamino]biphenyl (NPD) (U.S. Pat. No. 5,061,569) or MTDATA (JP A 4-308688), N,N,N',N'-tetra(4-biphenyl)-diaminobiphenylene (TBDB), 1,1-bis(4-di-p-tolylaminophenyl)cyclohexane (TAPC), 1,1-bis(4-di-p-tolylaminophenyl)-3-phenylpropane (TAPPP), 1,4-bis[2-[4-[N, N-di(p-tolyl)amino]phenyl]vinyl]benzene (BDTAPVB), N,N,N',N'-tetra-p-tolyl-4,4'-diaminobiphenyl (TTB), TPD, N,N,N',N'-tetraphenyl-4,4'''-diamino-1,1':4',1'':4'',1'''-quaterphenyl, likewise tertiary amines containing carbazole units, such as, for example, 4 (9H-carbazol-9-yl)-N, N-bis[4-(9H-carbazol-9-yl)phenyl]benzeneamine (TCTA). Preference may be likewise given to hexaazatriphenylene compounds in accordance with US 2007/0092755 A1.

Particular preference may be given to the following triarylamine compounds of the Formulae (6) to (11), which may also be substituted, and as disclosed in EP 1162193 A1, EP 650955 A1, Synth. Metals 1997, 91(1-3), 209, DE 19646119 A1, WO 2006/122630 A1, EP 1860097 A1, EP 1834945 A1, JP 08053397 A, U.S. Pat. No. 6,251,531 B1, and WO 2009/041635.

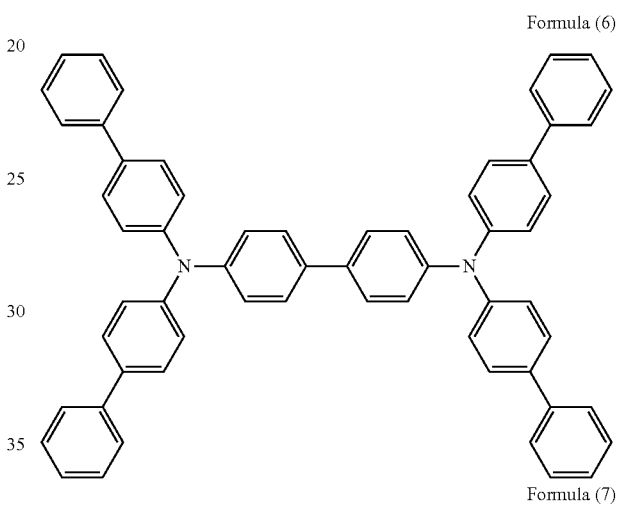

Formula (6)

Formula (7)

Formula (8)

Formula (9)
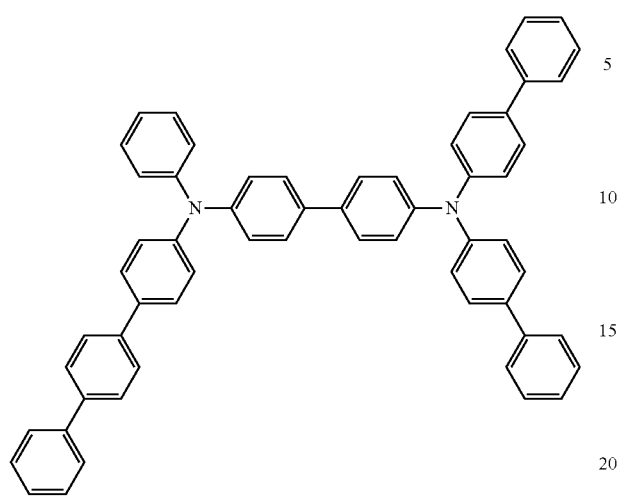
Formula (10)
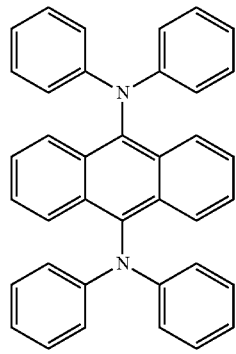
Formula (11)
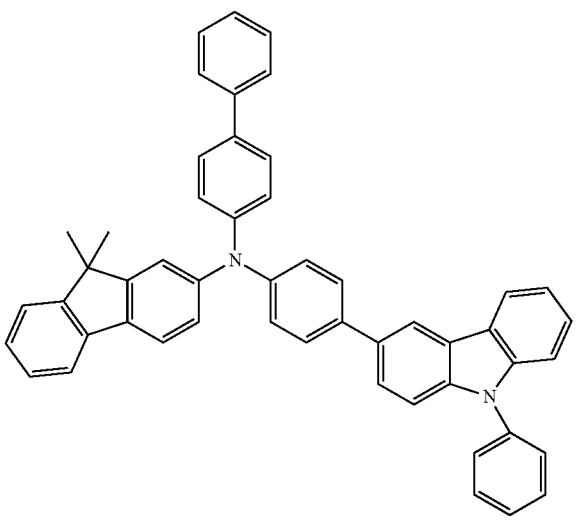
The shallow VB quantum dot comprising at least one ligand according to formula (I) can be synthesized by ligand exchange as reported for example by Denis Dorokhin, et al, in Nanotechnology (2010), 21, p 285703. A similar example can be shown as follows. Very particular preference may be given to the triarylamine with the formula (12):
Formula (12)
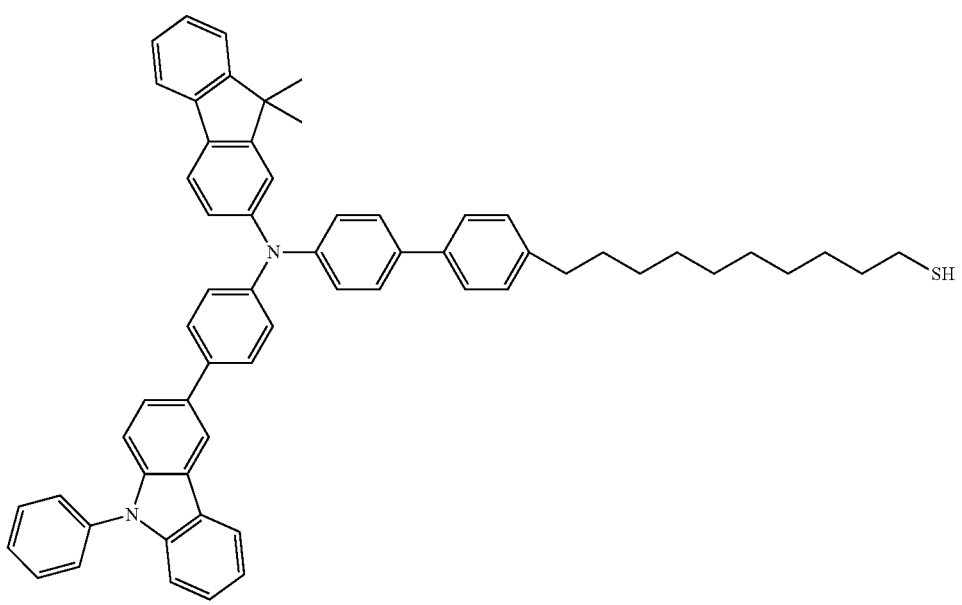

The ligand exchange can be realized by mixing the toluene solution of trioctylphosphine oxide (TOPO)-coated core-shell CdSe/ZnS QDs with a toluene solution of ligand 1 under nitrogen flow and with the help of heating for example at 40° C. By controlling the reaction time, different degree of ligand exchange can be obtained.

The organic host suitable for this and other embodiments described herein can be selected from the (polymeric) host materials as described above and any host or matrix materials for OLEDs known to one skilled in the art.

A host material is also called matrix or matrix material, particularly if a host is meant which is used in combination with a phosphorescent emitter in an OLED. For a copolymer, including an emitter unit, the polymer backbone may have the same function as a host and may be meant when reference is made to a host.

Preferably the host material suitable for the present invention is selected from the host materials for fluorescent emitter.

Preferred host materials for fluorescent emitter may be chosen from anthracenes, benzanthracenes, indenofluorenes, fluorenes, spirobifluorenes, phenanthrenes, dehydrophenanthrenes, thiophenes, triazines, imidazole and derivatives thereof.

Particularly preferred host materials for fluorescent emitter may be chosen from the classes of the oligoarylenes (for example 2,2',7,7'-tetraphenyl-spirobifluorene in accordance with EP 676461 or dinaphthylanthracene), in particular the oligoarylenes containing condensed aromatic groups, such as, for example, phenanthrene, tetracene, coronene, chrysene, fluorene, spirofluorene, perylene, phthaloperylene, naphthaloperylene, decacyclene, rubrene, the oligoarylenevinylenes (for example 4,4'-bis(2,2-diphenylethenyl)-1,1-biphenyl (DPVBi) or 4,4-bis-2,2-diphenylvinyl-1,1-spirobiphenyl (spiro-DPVBi) in accordance with EP 676461), the polypodal metal complexes (for example in accordance with WO 2004/081017), in particular metal complexes of 8 hydroxyquinoline, for example aluminium(III) tris(8-hydroxyquinoline) (aluminium quinolate, Alq$_3$) or bis(2-methyl-8-quinolinolato)-4-(phenylphenolinolato)aluminium, also with imidazole chelate (US 2007/0092753 A1) and quinoline-metal complexes, aminoquinoline-metal complexes, benzoquinoline-metal complexes, the hole-conducting compounds (for example in accordance with WO 2004/058911), the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052) or the benzanthracenes (e.g. DE 102007024850). Particularly preferred host materials may be chosen from the classes of the oligoarylenes, containing naphthalene, anthracene, benzanthracene and/or pyrene, or atropisomers of these compounds, the ketones, the phosphine oxides and the sulfoxides. Very particularly preferred host materials may be chosen from the classes of the oligoarylenes, containing anthracene, benzanthracene and/or pyrene, or atropisomers of these compounds. For the purposes of this invention, an oligoarylene is intended to be taken to optionally mean a compound in which at least three aryl or arylene groups are bonded to one another.

Further preferred host materials for fluorescent emitter may be chosen, in particular, from compounds of the Formula (13)

$$Ar^4-(Ar^5)_p-Ar^6 \quad \text{Formula (13)}$$

wherein
Ar$^4$, Ar$^5$, Ar$^6$ are on each occurrence, identically or differently, an aryl or heteroaryl group having 5 to 30 aromatic ring atoms, which may be substituted by one or more radicals and p is 1, 2, or 3, and the sum of the π-electrons in Ar$^4$, Ar$^5$ and Ar$^6$ is at least 30 if p=1 and is at least 36 if p=2 and is at least 42 if p=3.

It may be particularly preferred in the host materials of the Formula (13) for the group Ar$^5$ to stand for anthracene, which may be substituted by one or more radicals R$^1$, and for the groups Ar$^4$ and Ar$^6$ to be bonded in the 9 and 10-positions. Very particularly preferably, at least one of the groups Ar$^4$ and/or Ar$^6$ may be a condensed aryl group chosen from 1- or 2-naphthyl, 2-, 3- or 9-phenanthrenyl or 2-, 3-, 4-, 5-, 6- or 7-benzanthrax-cenyl, each of which may be substituted by one or more radicals R$^1$. Anthracene-based compounds are described in US 2007/0092753 A1 and US 2007/0252517 A1, for example 2-(4-methylphenyl)-9,10-di-(2-naphthyl)anthracene, 9-(2-naphthyl)-10-(1,1-biphenyl)anthracene and 9,10-bis[4-(2,2-diphenylethenyl)phenyl]anthracene, 9,10-diphenylanthracene, 9,10-bis(phenylethynyl)anthracene and 1,4-bis(9'-ethynylanthracenyl)benzene. Preference may be also given to host materials containing two anthracene units (US 2008/0193796 A1), for example 10,10'-bis[1,1',4',1"]terphenyl-2-yl-9,9'-bisanthracenyl.

Further preferred host materials may be derivatives of arylamine, styrylamine, fluorescein, perynone, phthaloperynone, naphthaloperynone, diphenylbutadiene, tetraphenylbutadiene, cyclopentadienes, tetraphenylcyclopentadiene, pentaphenylcyclopentadiene, coumarine, oxadiazole, bisbenzoxazoline, oxazone, pyridine, pyrazine, imine, benzothiazole, benzoxazole, benzimidazole (US 2007/0092753 A1), for example 2,2',2"-(1,3,5-phenylene)tris[1-phenyl-1H-benzimidazole], aldazines, stilbene, styrylarylene derivatives, for example 9,10-bis[4-(2,2-diphenylethenyl)phenyl]anthracene, and distyrylarylene derivatives (U.S. Pat. No. 5,121,029), diphenylethylene, vinylanthracene, diaminocarbazole, pyran, thiopyran, diketopyrrolopyrrole, polymethine, mellocyanine, acridone, quinacridone, cinnamic acid esters and fluorescent dyes.

Particular preference may be given to derivatives of arylamine and styrylamine, for example 4,4'-bis[N-(1-naphthyl)-N-(2-naphthyl)-amino]biphenyl (TNB).

Preferred compounds with oligoarylene as hosts for fluorescent emitter may be compounds as disclosed in, e.g., US 2003/0027016 A1, U.S. Pat. No. 7,326,371 B2, US 2006/043858 A, U.S. Pat. No. 7,326,371 B2, US 2003/0027016 A1, WO 2007/114358, WO 2008/145239, JP 3148176 B2, EP 1009044, US 2004/018383, WO 2005/061656 A1, EP 0681019B1, WO 2004/013073A1, U.S. Pat. No. 5,077,142, WO 2007/065678, and US 2007/0205412 A1. Particularly preferred oligoarylene-based compounds may be compounds having the Formulae (14) to (20).

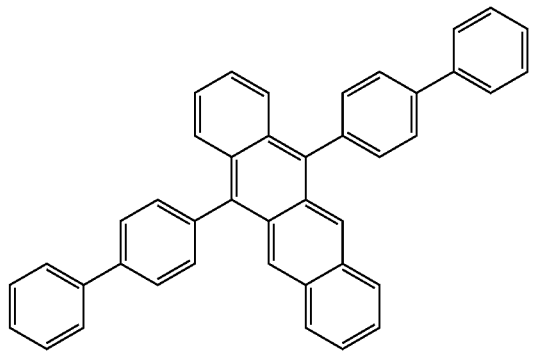

Formula (14)

Formula (15)

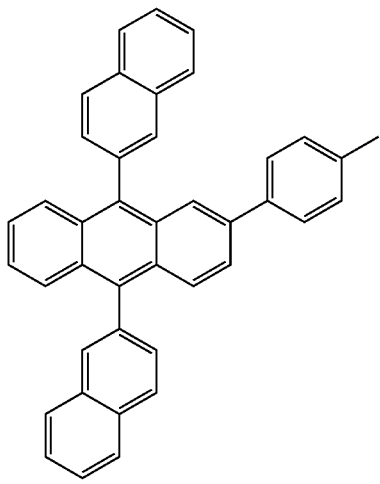

Formula (18)

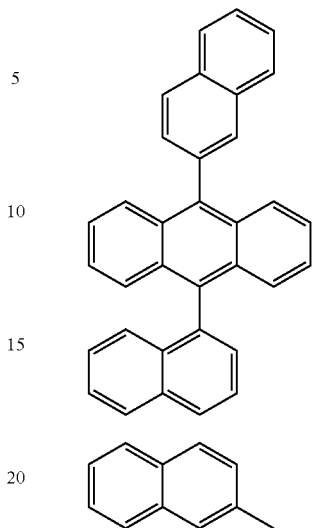

Formula (19)

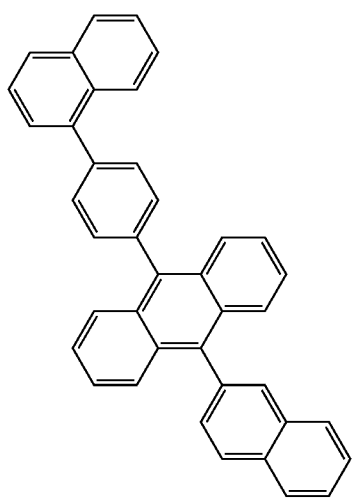

Formula (16)

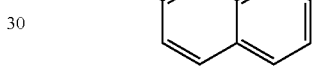

Formula (20)

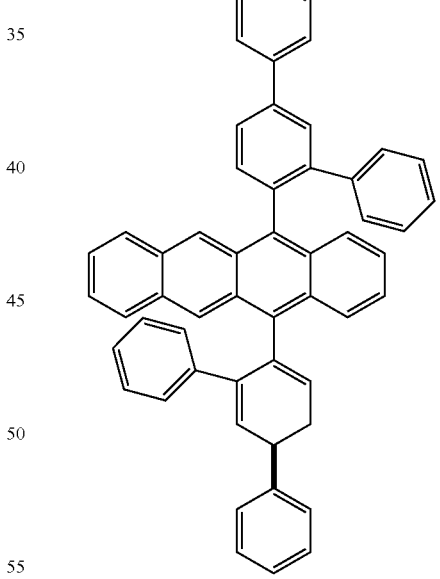

Formula (17)

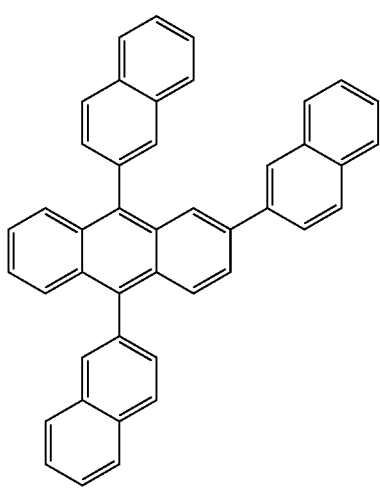

Further host materials for fluorescent emitter can be chosen from spirobifluorene and derivates thereof, for example Spiro-DPVBi as disclosed in EP 0676461 and indenofluorene as disclosed in U.S. Pat. No. 6,562,485.

Another preferred host material for the present invention is selected from host materials for phosphorescent emitter, i.e. matrix materials, which may be chosen from ketones, carbazoles, triarylamines, indenofluorenes, fluorenes, spirobifluorenes, phenanthrenes, dehydrophenanthrenes, thiophenes, triazines, imidazoles and their derivatives.

Preferred matrix materials may be N,N-biscarbazolylbiphenyl (CBP), carbazole derivatives (for example in accordance with WO 2005/039246, US 2005/0069729, JP 2004/288381, EP 1205527 or DE 102007002714), azacarbazoles (for example in accordance with EP 1617710, EP 1617711, EP 1731584, JP 2005/347160), ketones (for example in accordance with WO 2004/093207), phosphine oxides, sulfoxides and sulfones (for example in accordance with WO 2005/003253), oligophenylenes, aromatic amines (for example in accordance with US 2005/0069729), bipolar matrix materials (for example in accordance with WO 2007/137725), silanes (for example in accordance with WO 2005/111172), 9,9-diarylfluorene derivatives (e.g. in accordance with DE 102008017591), azaboroles or boronic esters (for example in accordance with WO 2006/117052), triazole derivatives, oxazoles and oxazole derivatives, imidazole derivatives, polyarylalkane derivatives, pyrazoline derivatives, pyrazolone derivatives, distyrylpyrazine derivatives, thiopyran dioxide derivatives, phenylenediamine derivatives, tertiary aromatic amines, styrylamines, indoles, anthrone derivatives, fluorenone derivatives, fluorenylidenemethane derivatives, hydrazone derivatives, silazane derivatives, aromatic dimethylidene compounds, porphyrin compounds, carbodiimide derivatives, diphenylquinone derivatives, phthalocyanine derivatives, metal complexes of 8 hydroxyquinoline derivatives, such as, for example, Alq$_3$, the 8 hydroxyquinoline complexes may also contain triarylaminophenol ligands (US 2007/0134514 A1), various metal complex-polysilane compounds with metal phthalocyanine, benzoxazole or benzothiazole as ligand, hole-conducting polymers, such as, for example, poly(N-vinylcarbazole) (PVK), aniline copolymers, thiophene oligomers, polythiophenes, polythiophene derivatives, poly-phenylene derivatives, polyfluorene derivatives.

Further particularly preferred matrix materials may be chosen from compounds including indolocarbazoles and their derivatives (e.g. Formulae (21) to (27)), as disclosed for examples in DE 102009023155.2, EP 0906947B1, EP 0908787B1, EP 906948B1, WO 2008/056746A1, WO 2007/063754A1, WO 2008/146839A1, and WO 2008/149691A1.

Formula (21)

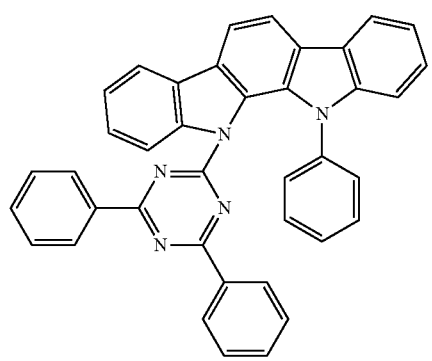

-continued

Formula (22)

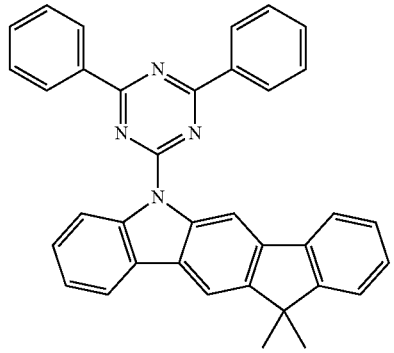

Formula (23)

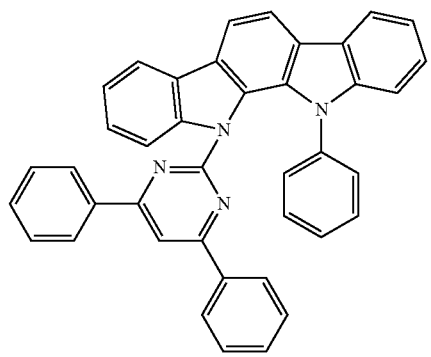

Formula (24)

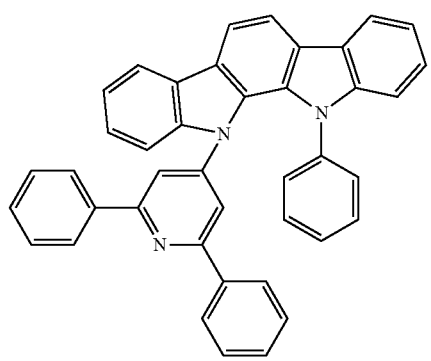

Formula (25)

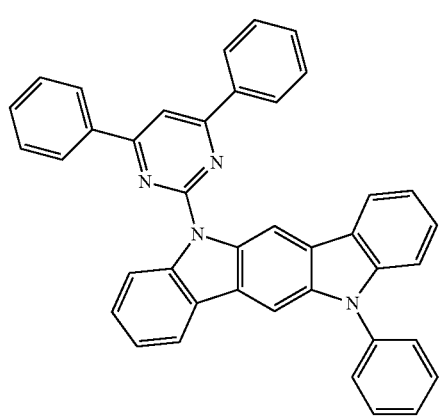

Formula (26)
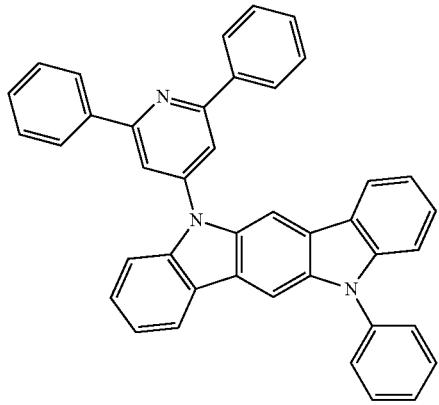
Formula (27)
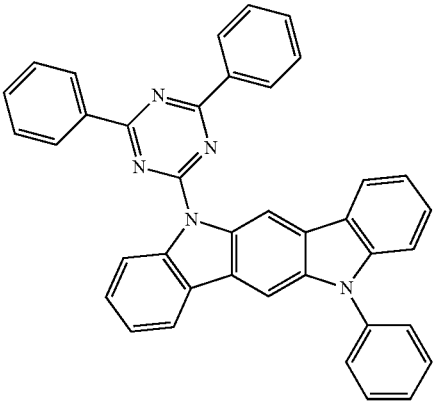
Examples of preferred carbazole derivatives are, 1,3-N,N-dicarbazolebenzene (=9,9'-(1,3-phenylene)bis-9H-carbazole) (mCP), 9,9'-(2,2'-dimethyl[1,1'-biphenyl]-4,4'-diyl)bis-9H-carbazole (CDBP), 1,3-bis(N,N'-dicarbazole)benzene(=1,3-bis(carbazol-9-yl)benzene), PVK (polyvinylcarbazole), 3,5-di(9H-carbazol-9-yl)biphenyl and compounds of the Formulae (28) to (32).
Formula (28)
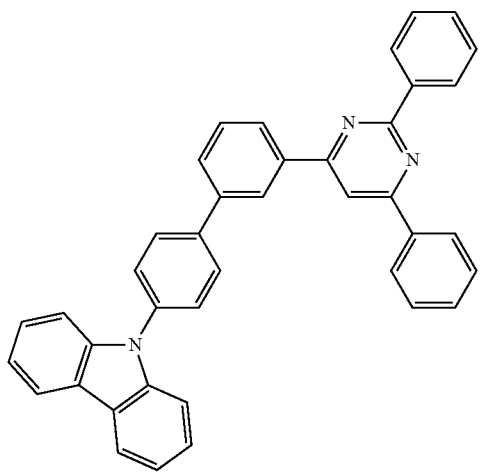
Formula (29)
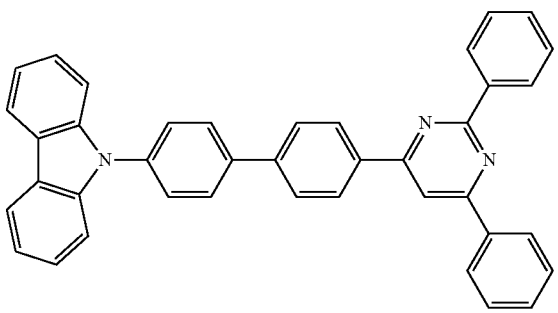
Formula (30)
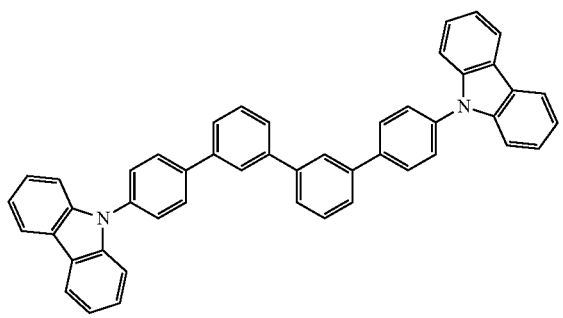
Formula (31)
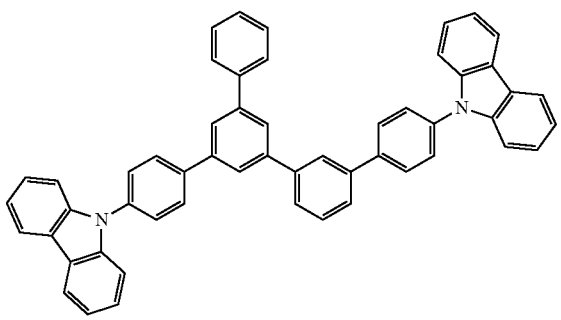

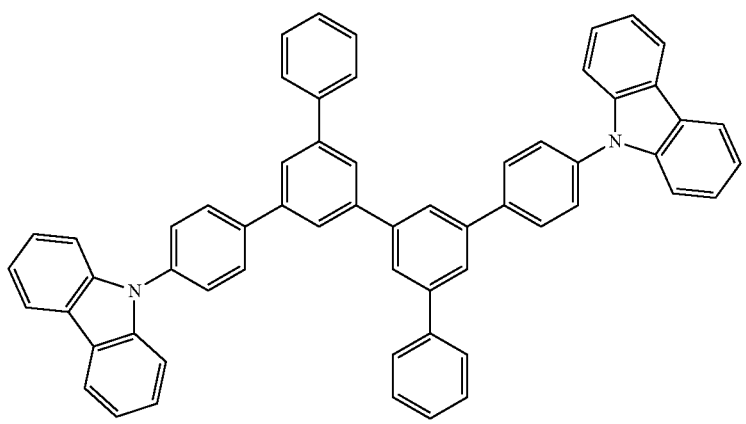

Formula (32)

Preferred Si tetraaryl compounds are, for example, (US 2004/0209115, US 2004/0209116, US 2007/0087219 A1, US 2007/0087219 A1) the compounds of the Formulae (33) to (38).

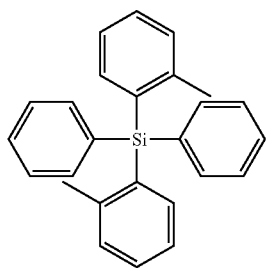

Formula (33)

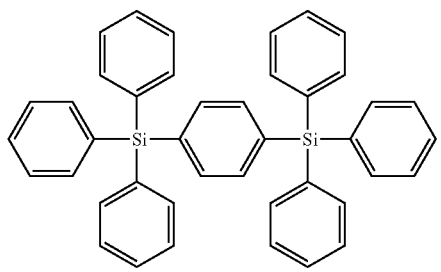

Formula (34)

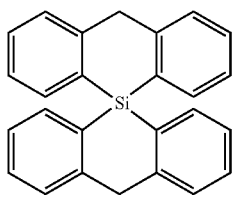

Formula (35)

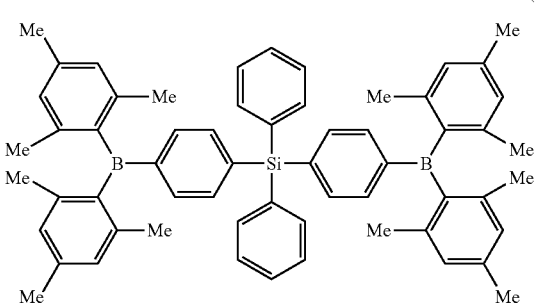

Formula (36)

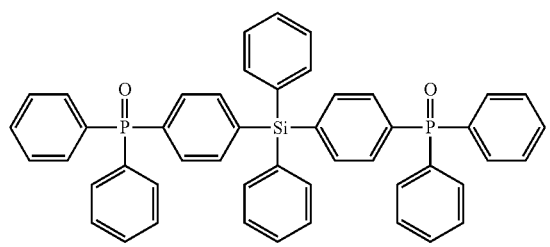

Formula (37)

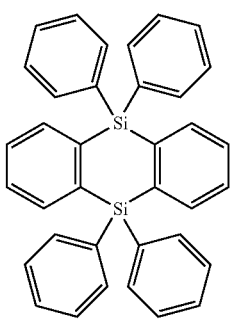

Formula (38)

A particularly preferred matrix for phosphorescent dopants may be the compound of Formula (39) (EP 652273 B1).

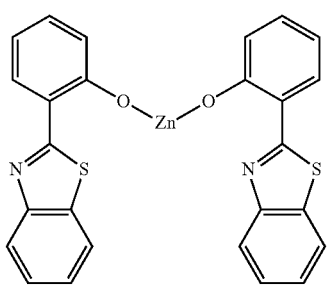

Formula (39)

Further particularly preferred matrix materials for phosphorescent dopants may be chosen from compounds of the general Formula (40) (EP 1923448A1).

$[M(L)_2]_n$     Formula (40)

wherein M, L, and n are defined as in the reference. Preferably M is Zn, and L is quinolinate, and n is 2, 3 or 4. Very particularly preferred are $[Znq_2]_2$, $[Znq_2]_3$, and $[Znq_2]_4$.

Preference may be given to co-hosts chosen from metal oxinoid complexes whereby lithium quinolate (Liq) or $Alq_3$ may particularly be preferred.

In a preferred embodiment, the matrix material is a small molecule (SM).

In another preferred embodiment, the matrix material is a conjugated polymer, optionally including an emitter group as a repeating unit, as described below.

In yet another preferred embodiment, the matrix material is a non-conjugated polymer, optionally including an emitter group as a repeating unit, as described below.

In an electronic device according to any embodiment described herein, the QD may include at least one element selected from Group II-VI, Group III-V, Group IV-VI and Group IV semiconductors, preferably ZnO, ZnS, ZnSe, ZnTe, CdS, CdSe, CdTe, HgS, HgSe, HgTe, MgS, MgSe, GeS, GeSe, GeTe, SnS, SnSe, SnTe, PbO, PbS, PbSe, PbTe, GaN, GaP, GaAs, GaSb, InN, InP, InAs, InSb, AlN, AlP, AlAs, AlSb, GaN, GaP, GaAs, GaSb, and an appropriate combination of two or more such semiconductors, and/or with core/shell, core multi-shell layered-structures thereof. In the electronic device according embodiments described herein, the concentration of the QD may be chosen such that the QD works as hole trap or electron trap in the organic host, preferably from 0.5 to 20 vol %, very preferably from 1 to 15 vol %, and most preferably from 2 to 10 vol %.

In one embodiment, the electronic device includes at least one further organic emitter which may preferably have an absorption spectrum overlapping with an emission spectrum of the quantum dot.

In a further preferred embodiment, the active layer may further include at least one organic emitter and/or at least one dye.

Preferably, the emission spectrum of the quantum dot overlaps with the absorption of the further organic emitter or dye. Thereby, a Förster energy transfer can be realized.

The suitable organic emitter can be selected from fluorescent or phosphorescent emitters. Preference is given to fluorescent emitters.

The term dopant as employed herein is also used for the term emitter or emitter material.

An organic fluorescent emitter suitable for embodiments described herein is preferably chosen from styrylamine derivatives, indenofluorene derivatives, polyaromatic compounds, anthracene derivatives, tetracene derivatives, xanthene derivatives, perylene derivatives, phenylene derivatives, fluorene derivatives, arylpyrenes derivatives, arylenevinylenes derivatives, rubrene derivatives, coumarine derivatives, rhodamine derivatives, quinacridone derivatives, dicyanomethylenepyrane derivatives, thiopyrans, polymethine derivatives, pyrylium and thiapyrylium salts, periflanthene derivatives, indenoperylene derivatives, bis(azinyl)-imine-boron compounds, bis(azinyl)methene compounds, carbostyryl compounds, monostyrylamines, distyrylamines, tristyrylamines, tetrastyrylamines, styrylphosphines, styryl ethers, arylamines, indenofluorene-amines and indenofluorene-diamines, benzoindenofluorene-amines, benzoindenofluorene-diamines, dibenzoindenofluorene-amines, dibenzo-indenofluorene-diamines, substituted or unsubstituted tristilbene-amines, distyrylbenzene and distyrylbiphenyl derivatives, triarylamines, naphthalene derivatives, anthracene derivatives, tetracene derivatives, fluorene derivatives, periflanthene derivatives, indenoperylene derivatives, phenanthrene derivatives, perylene derivatives, pyrene derivatives, chrysene derivatives, decacyclene derivatives, coronene derivatives, tetraphenylcyclopentadiene derivatives, pentaphenylcyclopentadiene derivatives, fluorene derivatives, spirofluorene derivatives, pyran derivatives, oxazone derivatives, benzoxazole derivatives, benzothiazole derivatives, benzimidazole derivatives, pyrazine derivatives, cinnamic acid esters, diketopyrrolopyrrole derivatives, and acridone derivatives.

Blue fluorescent emitters may preferably be polyaromatic compounds, such as, for example, 9,10-di(2-naphthylanthracene) and other anthracene derivatives, derivatives of tetracene, xanthene, perylene, such as, for example, 2,5,8,11-tetra-t-butylperylene, phenylene, for example 4,4'-(bis(9-ethyl-3-carbazovinylene)-1,1'-biphenyl, fluorene, arylpyrenes (US 2006/0222886), arylenevinylenes (U.S. Pat. No. 5,121,029, U.S. Pat. No. 5,130,603), derivatives of rubrene, coumarine, rhodamine, quinacridone, such as, for example, N,N'-dimethylquinacridone (DMQA), dicyanomethylenepyrane, such as, for example, 4 (dicyanoethylene)-6-(4-dimethylaminostyryl-2-methyl)-4H-pyrane (DCM), thiopyrans, polymethine, pyrylium and thiapyrylium salts, perifianthene, indenoperylene, bis(azinyl)imine-boron compounds (US 2007/0092753 A1), bis(azinyl)methene compounds and carbostyryl compounds.

Further preferred blue fluorescent emitters may be emitters which are described in C. H. Chen et al.: "Recent developments in organic electroluminescent materials" Macromol. Symp. 125, (1997), 1-48 and "Recent progress of molecular organic electroluminescent materials and devices" Mat. Sci. and Eng. R, 39 (2002), 143-222.

Preferred fluorescent dopants according to embodiments may be chosen from the class of the monostyrylamines, the distyrylamines, the tristyrylamines, the tetrastyrylamines, the styrylphosphines, the styryl ethers and the arylamines.

A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups may particularly preferably be stilbenes, which may also be further substituted. The corresponding phosphines and ethers are defined analogously to the amines. For the purposes of this invention, an arylamine or an aromatic amine is taken to optionally mean a compound which contains three substituted or unsubstituted aromatic or heteroaromatic ring systems bonded directly to the nitrogen. At least one of these aromatic or heteroaromatic ring systems may preferably be a condensed ring system, preferably having at least 14 aromatic ring atoms. Preferred examples thereof are aromatic anthracene-amines, aromatic anthracene-diamines, aromatic pyrene-amines, aromatic pyrene-diamines, aromatic chrysene-amines and aromatic chrysene-diamines. An aromatic anthracene-amine may be taken to mean a compound in which one diarylamino group is bonded directly to an anthracene group, preferably in the 9 position. An aromatic anthracene-diamine may be taken to mean a compound in which two diarylamino groups are bonded directly to an anthracene group, preferably in the 9,10-position. Aromatic pyrene-amines, pyrene-diamines, chrysene-amines and chrysene-diamines are defined analogously thereto, where the diarylamino groups on the pyrene are preferably bonded in the 1 position or in the 1,6-position.

Further preferred fluorescent dopants may be chosen from indenofluorene-amines and indenofluorene-diamines, for example in accordance with WO 2006/122630, benzoindenofluorene-amines and benzoindenofluorene-diamines, for example in accordance with WO 2008/006449, and dibenzoindenofluorene-amines and dibenzoindenofluorene-diamines, for example in accordance with WO 2007/140847.

Examples of dopants from the class of the styrylamines are substituted or unsubstituted tristilbene-amines or the dopants described in WO 2006/000388, WO 2006/058737, WO 2006/000389, WO 2007/065549 and WO 2007/115610. Distyrylbenzene and distyrylbiphenyl derivatives are described in U.S. Pat. No. 5,121,029. Further styrylamines are found in US 2007/0122656 A1.

Particularly preferred styrylamine dopants and triarylamine dopants are the compounds of the Formulae (41) to (46) and as disclosed in U.S. Pat. No. 7,250,532 B2, DE 102005058557 A1, CN 1583691 A, JP 08053397 A, U.S. Pat. No. 6,251,531 B1, and US 2006/210830 A.

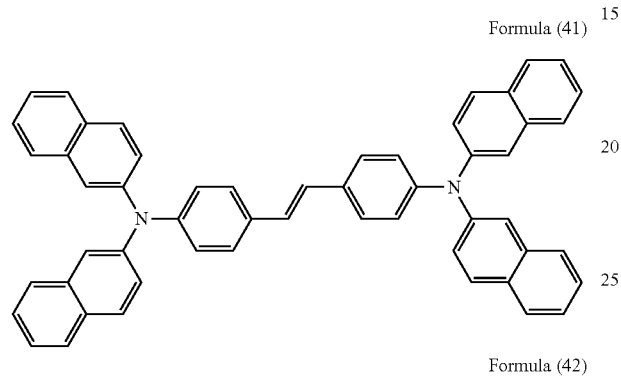

Formula (41)

Formula (42)

Formula (43)

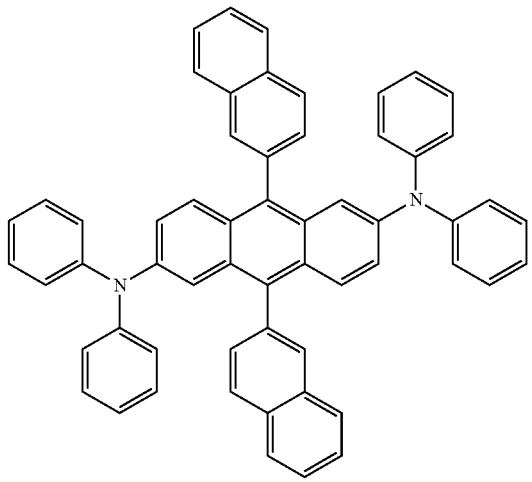

Formula (44)

Formula (45)

Formula (46)

Further preferred fluorescent dopants may be chosen from the group of triarylamines as disclosed in EP 1957606 A1 and US 2008/0113101 A1.

Further preferred fluorescent dopants may be chosen from derivatives of naphthalene, anthracene, tetracene, fluorene, periflanthene, indenoperylene, phenanthrene, perylene (US 2007/0252517 A1), pyrene, chrysene, decacyclene, coronene, tetraphenylcyclopentadiene, pentaphenylcyclopentadiene, fluorene, spirofluorene, rubrene, coumarine (U.S. Pat. No. 4,769,292, U.S. Pat. No. 6,020,078, US 2007/0252517 A1), pyran, oxazone, benzoxazole, benzothiazole, benzimidazole, pyrazine, cinnamic acid esters, diketopyrrolopyrrole, acridone and quinacridone (US 2007/0252517 A1).

Of the anthracene compounds, particular preference may be given to 9,10-substituted anthracenes, such as, for example, 9,10-diphenylanthracene and 9,10-bis(phenylethynyl)anthracene. 1,4-Bis(9'-ethynylanthracenyl)benzene may be also a preferred dopant.

Examples of phosphorescent emitters are revealed by the applications WO 00/70655, WO 01/41512, WO 02/02714, WO 02/15645, EP 1191613, EP 1191612, EP 1191614 and WO 2005/033244. In general, all phosphorescent complexes as used in accordance with the prior art for phosphorescent OLEDs and as are known to the person skilled in the art in the area of organic electroluminescence are suitable.

For the purposes of this invention, phosphorescence is taken to mean luminescence from an excited state of relatively high spin multiplicity, i.e. a spin state >1, in particular from an excited triplet state. For the purposes of this application, all luminescent transition-metal complexes and luminescent lanthanide complexes, in particular all iridium, platinum and copper complexes, are to be regarded as phosphorescent compounds. The phosphorescent emitter may be a metal complex, preferably with the formula $M(L)_z$, wherein M is a metal atom, L is in each occurrence independently of one another an organic ligand that is bonded to or coordinated with M via one, two or more positions, and z is an integer ≥1, preferably 1, 2, 3, 4, 5 or 6, and wherein, optionally, these groups are linked to a polymer via one or more, preferably one, two or three positions, preferably via the ligands L.

M may be in particular a metal atom chosen from transition metals, preferably chosen from transition metals of group VIII, or lanthanoides, or actinides, particularly preferably chosen from Rh, Os, Ir, Pt, Pd, Au, Sm, Eu, Gd, Tb, Dy, Re, Cu, Zn, W, Mo, Pd, Ag, or Ru, and very particularly preferably chosen from Os, Ir, Ru, Rh, Re, Pd, or Pt. M may also be Zn.

Preferred ligands L may be 2 phenylpyridine derivatives, 7,8-benzoquinoline derivatives, 2 (2-thienyl)pyridine derivatives, 2 (1-naphthyl)pyridine derivatives or 2 phenylquinoline derivatives. All these compounds may be substituted, for example by fluoro- or trifluoromethyl substituents for blue. Auxiliary ligands are preferably acetylacetonate or picric acid.

In particular, complexes of Pt or Pd with tetradentate ligands of the Formula (47) as disclosed in US 2007/0087219 A1, wherein $R^1$ to $R^{14}$ and $Z^1$ to $Z^5$ are as defined in the reference, Pt porphyrin complexes having an enlarged ring system (US 2009/0061681 A1) and Ir complexes are suitable, for example 2,3,7,8,12,13,17,18-octaethyl-21H,23H-porphyrin-Pt(II), tetraphenyl-Pt(II)-tetrabenzoporphyrin (US 2009/0061681 A1), cis-bis(2-phenylpyridinato-N,C2')Pt(II), cis-bis(2-(2'-thienyl)pyridinato-N,C3')Pt(II), cis-bis(2-(2'-thienyl)quinolinato-N,C5')Pt(II), (2-(4,6-difluorophenyl)pyridinato-N,C2')Pt(II) acetylacetonate, or tris(2-phenylpyridinato-N,C2')Ir(III) (Ir(ppy)$_3$, green), bis(2-phenylpyridinato-N,C2)Ir(III) acetylacetonate (Ir(ppy)$_2$ acetylacetonate, green, US 2001/0053462 A1, Baldo, Thompson et al. Nature 403, (2000), 750-753), bis(1-phenylisoquinolinato-N,C2')(2-phenylpyridinato-N,C2')iridium(III), bis(2-phenylpyridinato-N,C2')(1-phenylisoquinolinato-N,C2')iridium(III), bis(2-(2'-benzothienyl)pyridinato-N,C3')iridium(III) acetylacetonate, bis(2-(4',6'-difluorophenyl)pyridinato-N,C2')iridium(III) piccolinate (Firpic, blue), bis(2-(4',6'-difluorophenyl)pyridinato-N,C2')Ir(III) tetrakis(1-pyrazolyl)borate, tris(2-(biphenyl-3-yl)-4-tert-butylpyridine)iridium(III), (ppz)$_2$Ir(5phdpym) (US 2009/0061681 A1), (45ooppz)$_2$Ir(5phdpym) (US 2009/0061681 A1), derivatives of 2 phenylpyridine-Ir complexes, such as, for example, iridium(III) bis(2-phenylquinolyl-N,C2')acetylacetonate (PQIr), tris(2-phenylisoquinolinato-N,C3)Ir(III) (red), bis(2-(2'-benzo[4,5-a]thienyl)pyridinato-N,C3)Ir acetylacetonate ([Btp2Ir(acac)], red, Adachi et al. Appl. Phys. Lett. 78 (2001), 1622-1624).

Formula (47)

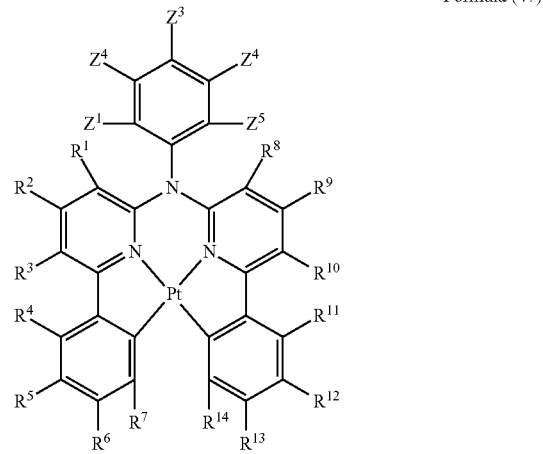

Also suitable are complexes of trivalent lanthanides, such as, for example, $Tb^{3+}$ and $Eu^{3+}$ (J. Kido et al. Appl. Phys. Lett. 65 (1994), 2124, Kido et al. Chem. Lett. 657, 1990, US 2007/0252517 A1), or phosphorescent complexes of Pt(II), Ir(I), Rh(I) with maleonitrile dithiolate (Johnson et al., JACS 105, 1983, 1795), Re(I) tricarbonyl diimine complexes (Wrighton, JACS 96, 1974, 998 inter alia), Os(II) complexes with cyano ligands and bipyridyl or phenanthroline ligands (Ma et al., Synth. Metals 94, 1998, 245) or Alq$_3$ without a host.

Further phosphorescent emitters with tridentate ligands are described in U.S. Pat. No. 6,824,895 and U.S. Pat. No. 7,029,766. Red-emitting phosphorescent complexes are mentioned in U.S. Pat. No. 6,835,469 and U.S. Pat. No. 6,830,828.

A particularly preferred phosphorescent dopant may be a compound with the Formula (48) and further compounds as disclosed, e.g., in US 2001/0053462 A1.

A particularly preferred phosphorescent dopant may be a compound with the Formula (49) and further compounds as disclosed, e.g., in WO 2007/095118 A1

Formula (48)

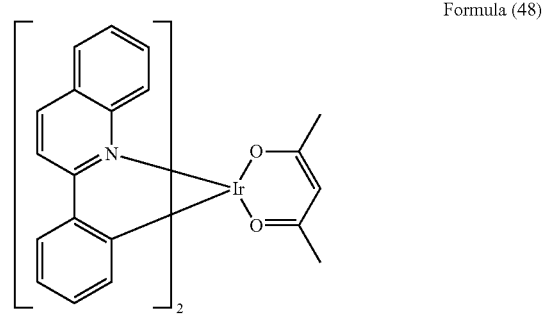

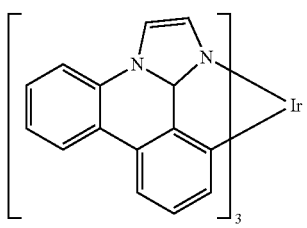

Formula (49)

Further derivatives are described in U.S. Pat. No. 7,378,162 B2, U.S. Pat. No. 6,835,469 B2, and JP 2003/253145 A.

Further to a metal complex mentioned elsewhere herein, a suitable metal complex according to embodiments can be chosen from transition metals, rare earth elements, lanthanides and actinides and may be also subject of embodiments described herein. Preferably the metal may be chosen from Ir, Ru, Os, Eu, Au, Pt, Cu, Zn, Mo, W, Rh, Pd, or Ag.

In principle any dye, which is suitable for organic solar cells or organic dye-sensitized solar cells, can be used in the present invention. Further to dyes mentioned elsewhere herein, according to embodiments, dyes can be chosen from perylenes, ruthenium dyes, phthalocyanines, azo dyes, perylene-diimides, porphyrines, squaraines, isomers and derivatives thereof.

Preferably, the dye may be chosen from perylenes, ruthenium dyes, phthalocyanines, azo dyes, perylene-diimides, porphyrines, and squaraines. Also preferred dyes may be chosen from ruthenium complexes as disclosed by Yu Bai et. al., in Nature Materials, Vol 7, 626 (2008) and by B. O'Regan et. al., in Nature 353, 737 (1991), and Cu based complexes as disclosed by Bessho et al, in Chem. Commun. 3717 (2008).

Further, the dyes used in embodiments may be chosen from acridines, anthraquinones, arylmethanes, diarylmethanes, triarylmethanes, azo-based dyes, cyanines, diazonium-based dyes, nitro-based dyes, nitroso-based dyes, quinone-imines, azin-based dyes, eurhodines, safranines, indulines, indamins, indophenoles, oxazines, oxazones, thiazines, thiazoles, xanthenes, fluorenes, pyronines, fluorones, and rhodamines.

In addition to dyes used in embodiments described herein, charge generation materials used for electrophotographic devices can also have the same function as a dye. Thus charge generation materials used for electrophotographic devices as summarized by Paul M. Borsenberger; and David S. Weiss in Organic Photorecptors for Xerography; Marcel Dekker, Inc., 1998, Chapter 6, and by K. Y. Law, Chem. Rev. Vol 93, 449-486 (1993) are herein also considered as suitable dye.

Further suitable dyes may be chosen from organic compounds containing fused ring system, for example anthracene, naphthalene, pentacene and tetracence derivatives.

The electronic device according the present invention can be selected from light emitting diodes, photovoltaic device, photo-diode and sensors.

In a preferred embodiment, the electronic device of the present invention includes a sequence as described below:
- optionally a first substrate,
- an anode layer,
- a charge generation layer or a hole injection layer,
- optionally an electron and/or exciton blocking layer,
- an active layer including quantum dot and organic host as described above and below,
- optionally a hole and/or exciton blocking layer,
- optionally an electron transport layer
- optionally an electron injection layer or buffer layer
- a cathode layer,
- optionally a second substrate.

In one preferred embodiment, the electronic device is a light emitting diode. Typical device structures for light emitting diodes are described elsewhere within the present invention. In a very preferred embodiment, the light emitting device further includes an electron transport layer and/or an electron injection layer. To this end, the light emitting device may include an electron transport material and/or an electron injection material.

In principle any electron injection material (EIM) known to one skilled in the art can be employed according to embodiments. Further to EIM mentioned elsewhere herein, EIMs, which include at least one organic compound chosen from metal complexes of 8-hydroxyquinoline, heterocyclic organic compounds, fluorenones, fluorenylidene methane, perylenetetracarboxylic acid, anthraquinone dimethanes, diphenoquinones, anthrones, anthraquinonediethylene-diamines, isomers and derivates thereof can be used according to embodiments.

Metal complexes of 8 hydroxyquinoline, such as, for example, $Alq_3$ and $Gaq_3$, can be used as EIM for electron-injection layers. A reducing doping with alkali metals or alkaline-earth metals, such as, for example, Li, Cs, Ca or Mg, at the interface to the cathode is advantageous. Preference may be given to combinations which include Cs, for example Cs and Na, Cs and K, Cs and Rb or Cs, Na and K.

Heterocyclic organic compounds, such as, for example, 1,10-phenanthroline derivatives, benzimidazoles, thiopyran dioxides, oxazoles, triazoles, imidazoles or oxadiazoles, are likewise suitable. Examples of suitable five-membered rings containing nitrogen are oxazoles, thiazoles, oxadiazoles, thiadiazoles, triazoles, and compounds which are disclosed in US 2008/0102311 A1.

Preferred EIMs may be chosen from compounds with the Formulae (50) to (52), which may be substituted or unsubstituted.

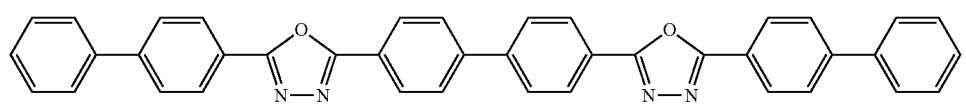

Formula (50)

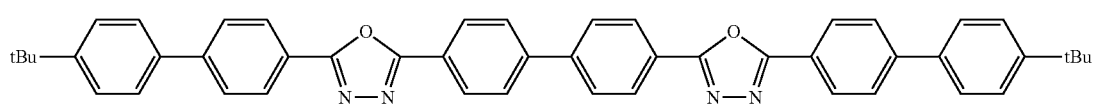

Formula (51)

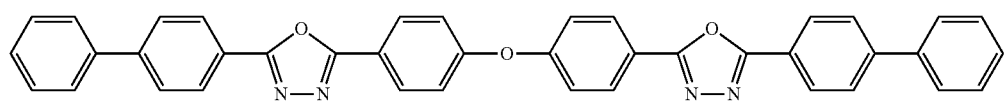

Formula (52)

Organic compounds, such as fluorenones, fluorenylidene methane, perylenetetracarboxylic acid, anthraquinone dimethanes, diphenoquinones, anthrones and anthraquinonediethylenediamines, can also be employed, for example

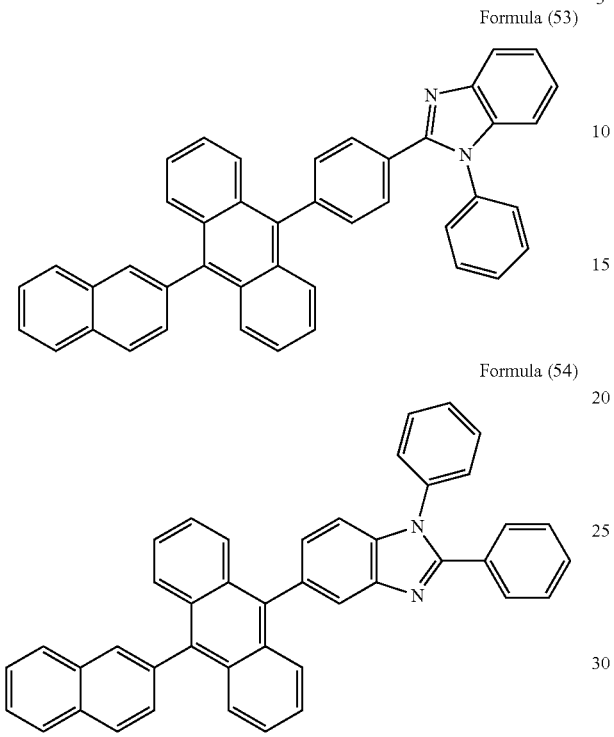

Formula (53)

Formula (54)

In principle, any electron transport material (ETM) known to one skilled in the art can be employed according to embodiments described herein. Further to ETM mentioned elsewhere herein, a suitable ETM may be chosen from the group consisting of imidazoles, pyridines, pyrimidines, pyridazines, pyrazines, oxadiazoles, chinolines, chinoxalines, anthracenes, benzanthracenes, pyrenes, perylenes, benzimidazoles, triazines, ketones, phosphinoxides, phenazines, phenanthrolines, triarylboranes, isomers and derivatives thereof.

Suitable ETMs for electron-transporting layers are metal chelates of 8 hydroxyquinoline (for example Liq, Alq$_3$, Gaq$_3$, Mgq$_2$, Znq$_2$, Inq3, Zrq$_4$), Balq, 4 azaphenanthrene-5-ol/Be complexes (U.S. Pat. No. 5,529,853 A; e.g. Formula (55)), butadiene derivatives (U.S. Pat. No. 4,356,429), heterocyclic optical brighteners (U.S. Pat. No. 4,539,507), benzazoles, such as, for example, 1,3,5-tris(2-N-phenylbenzimidazolyl) benzene (TPBI) (U.S. Pat. No. 5,766,779, Formula (56)), 1,3,5-triazines, pyrenes, anthracenes, tetracenes, fluorenes, spirobifluorenes, dendrimers, tetracenes, for example rubrene derivatives, 1,10-phenanthroline derivatives (JP 2003/115387, JP 2004/311184, JP 2001/267080, WO 2002/043449), silacyl-cyclopentadiene derivatives (EP 1480280, EP 1478032, EP 1469533), pyridine derivatives (JP 2004/200162 Kodak), phenanthrolines, for example BCP and Bphen, also a number of phenanthrolines bonded via biphenyl or other aromatic groups (US 2007/0252517 A1) or phenanthrolines bonded to anthracene (US 2007/0122656 A1, e.g. Formulae (57) and (58)), 1,3,4-oxadiazoles, for example Formula (59), triazoles, for example Formula (60), triarylboranes, for example also with Si, benzimidazole derivatives and other N heterocyclic compounds (cf. US 2007/0273272 A1), silacyclopentadiene derivatives, borane derivatives, Ga oxinoid complexes.

Preference may be given to 2,9,10-substituted anthracenes (with 1- or 2-naphthyl and 4- or 3-biphenyl) or molecules which contain two anthracene units (US 2008/0193796 A1).

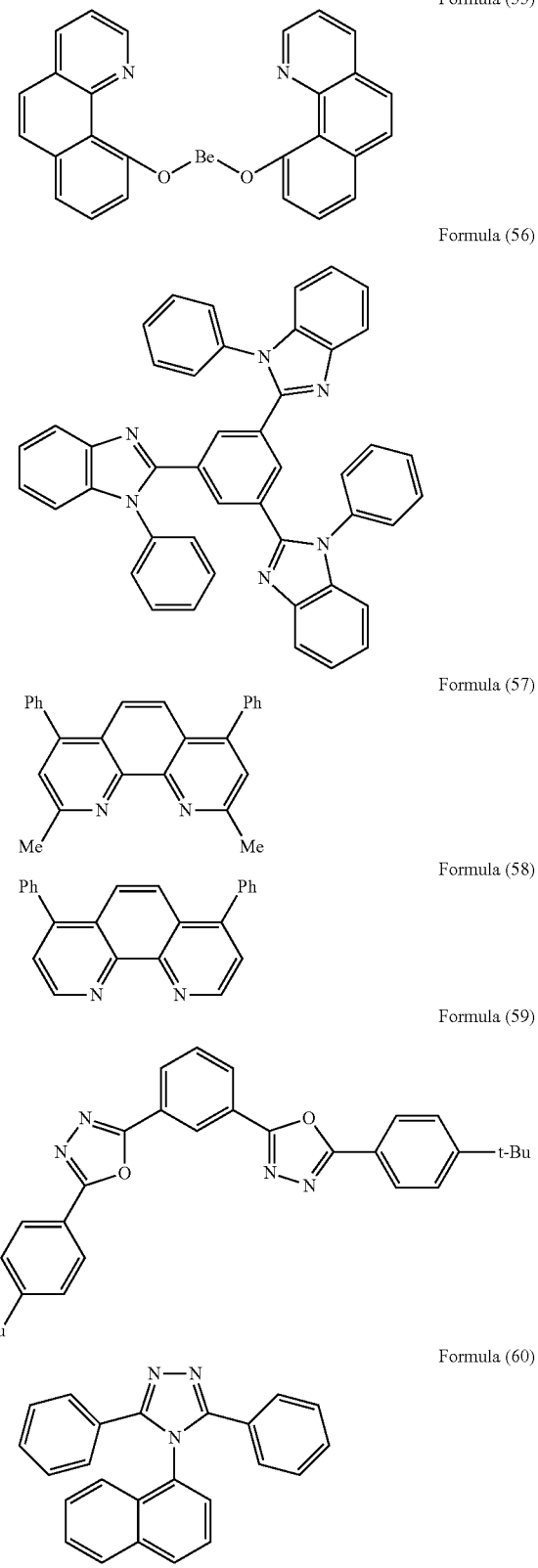

Formula (55)

Formula (56)

Formula (57)

Formula (58)

Formula (59)

Formula (60)

Preference may be likewise given to anthracene-benzimidazole derivatives, such as, for example, the compounds of Formulae (61) to (63), and as disclosed in, e.g., U.S. Pat. No. 6,878,469 B2, US 2006/147747 A, and EP 1551206 A1.

Formula (61)

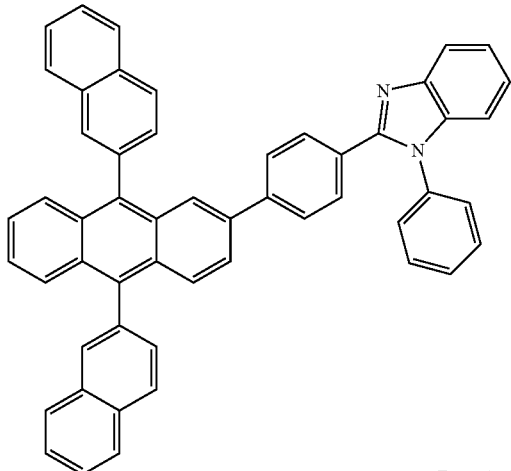

Formula (62)

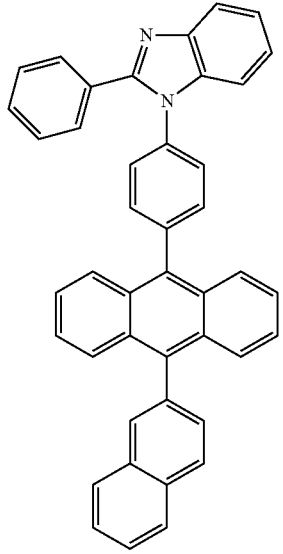

Formula (63)

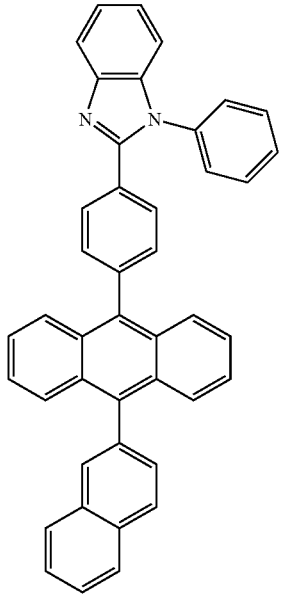

In another preferred embodiment, the electronic device of the present invention is a photovoltaic cell, wherein the active layer includes at least one quantum dot, at least one organic host and at least one dye as described above and below.

The present invention further related to a mixture used in and according to embodiments described herein, which comprises at least one quantum dot and at least one organic host, wherein the ionisation potential or the VB of the quantum dot is at least 0.3 eV, preferably 0.4 ev, very preferably 0.5 eV higher than the HOMO of the organic host.

The mixture may be characterised in that the organic host has a bigger band gap than the quantum dot.

In the mixture according to any embodiment described herein, the quantum dot may have a HOMO higher than higher than −5.7 eV, preferably −5.5 eV, very preferably −5.3 eV.

The present invention yet further relates to a mixture used in and according to embodiments described herein, comprising a quantum dot and an organic host, characterised in that the organic host is selected from organic compounds having a HOMO at least lower than −6.0 eV (hereafter called deep-HOMO host).

The said deep HOMO organic host can be selected from compounds including strong electron-withdrawing group(s), which can be preferably selected from halogen, nitrile, carbonyl and nitro groups, for example —F, —CN, —CO, and —$NO_2$.

The said deep HOMO organic host can be selected from a small molecule, an oligomer, a polymer and dendrimer, or a combination thereof.

In a preferred embodiment, the deep-HOMO organic host is a copolymer, and more preferably a conjugated copolymer, which includes at least one repeating unit, which has a deep HOMO.

In a very preferred embodiment, the said deep-HOMO host is a polymer comprising at least one repeating unit, which is selected from formulae (1) to (4).

In the mixture according to any embodiment described herein, the QD may include at least one element selected from selected from Group II-VI, Group III-V, Group IV-VI and Group IV semiconductors, preferably ZnO, ZnS, ZnSe, ZnTe, CdS, CdSe, CdTe, HgS, HgSe, HgTe, MgS, MgSe, GeS, GeSe, GeTe, SnS, SnSe, SnTe, PbO, PbS, PbSe, PbTe, GaN, GaP, GaAs, GaSb, InN, InP, InAs, InSb, AlN, AlP, AlAs, AlSb, GaN, GaP, GaAs, GaSb, and an appropriate combination of two or more such semiconductors, and/or with core/shell, core multi-shell layered-structures thereof.

In the mixture according to any embodiment described herein, the organic host may be selected from a small molecule and/or a polymer.

The mixture according to any embodiment described herein may be characterised in that the concentration of the QD is chosen such that it works as hole trap in the organic host, preferably from 0.5 to 30 wt %, very preferably from 1 to 20 wt %, and most preferably from 5 to 15 wt %.

The mixture according to any embodiment described herein may include at least further one emitter. In the mixture according to any embodiment described herein the emission spectrum of the quantum dot may overlap with the absorption of the further emitter. Thereby, a Förster energy transfer can be realized. In the mixture according to any embodiment described herein, the further emitter can be selected from organic compounds or other quantum dots.

In one embodiment, a method for preparing a quantum dot according to any of embodiment described herein includes forming the quantum dot by ligand exchange.

According to a further embodiment, an electronic device includes a mixture according to any embodiment described herein or a shallow VB quantum dots according to any embodiment described herein. The electronic device may include at least one anode, one cathode and a functional layer in-between the anode and the cathode, wherein the functional layer includes the mixture or the quantum dot. The electronic device may be characterized in that the device is a light emitting, light converting, light harvesting, or light sensor device selected from organic light emitting diodes (OLED), polymer light emitting diodes (PLED), organic light emitting electrochemical cells, organic field effect transistors (OFET), thin film transistors (TFT), organic solar cells (O-SC), organic laser diodes (O-laser), organic integrated circuits (O-IC), radio frequency identification (RFID) tags, photodetector, sensors, logic circuits, memory elements, capacitor, charge injection layers, Schottky diodes, planarising layers, antistatic films, conducting substrates or patterns, photoconductors, electrophotographic elements, organic light emitting transistors (OLET), organic spintronic devices, and an organic plasmon emitting devices (OPEDs), preferably selected from organic light emitting diodes.

Another aspect of the invention relates to a formulation, preferably a solution, comprising a mixture or a shallow VB quantum dots according to any embodiment described herein and one or more organic solvents;

Examples of suitable and preferred organic solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetralin, decalin, indane and/or mixtures thereof.

The concentration of the mixture in the solution is preferably 0.1 to 10% by weight, more preferably 0.5 to 5% by weight. Optionally, the solution also comprises one or more binders to adjust the rheological properties, as described in WO 2005/055248 A1.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p 9-10, 1986". Such a procedure may lead to a blend of 'non' solvents that will dissolve the mixture, although it is desirable to have at least one true solvent in a blend.

Another preferred form of a formulation according to the present invention is an emulsion, and very preferably a mini-emulsion, which are specially formulated heterophase systems in which stable nanodroplets of one phase are dispersed in a second, continuous phase. The present invention relates to a mini-emulsion, wherein the different components of the mixture are located either in the same phase or in the different phases. Preferred distributions are as follows:
1) majority or all of QDs in nanodroplets (discontinuous phase), and majority or all of organic emitters and other functional compounds in the continuous phase;
2) majority or all of QDs, organic emitters and host materials in nanodroplets, and majority or all of other functional compounds, such as co-host material or ETM or HTM, in the continuous phase.

Both mini-emulsion, wherein the continuous phase is a polar phase, and inverse miniemulsion, wherein the continuous phase is a non-polar phase, could be used in the present invention. The preferred form is the mini-emulsion. To increase the kinetic stability of the emulsion, surfactant(s) could be added. The selection of solvents for two phase and surfactants, and the processing to make a stable mini-emulsion is well known to one skilled in the art, or are referred to various publications, for example, Landfester et al. in Annu. Rev. Mater. Res. (06), 36, 231.

For use as thin layers in electronic or opto-electronic devices the mixture or a formulation of them of the present invention may be deposited by any suitable method. Liquid coating of devices such as light emitting device is more desirable than vacuum deposition techniques. Solution deposition methods are particularly preferred. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing, slot-die coating. Ink-jet printing is particularly preferred as it allows high resolution displays to be prepared.

Selected solutions of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the mixture of the present invention should be first dissolved in a suitable solvent. Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents methoned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing mixture of the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and the mixture) preferably has a viscosity at 20° C. of 1 to 100 mPa·s, more preferably 1 to 50 mPa·s and most preferably 1 to 30 mPa·s.

The mixture or a formulation of them according to the present invention can additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, or inhibitors.

In another embodiment, the formulation of any other embodiment described herein can be used in the manufacture of an opto-electronic device, preferably an electroluminescent device.

The quantum dots, devices and mixtures according to the present invention can be used for the treatment, prophylaxis, and/or diagnosis of diseases and/or cosmetic conditions.

Treatment and or prophylaxis includes any kind of phototherapy, photodynamic therapy, and any combination of light therapy and therapies not using light such as drug therapies, commonly referred herein as to light therapy or light treatment. Light treatments may be directed to outer surfaces of the subject to be treated such as skin, wounds, mucosa, eye, hair, nail, nail beds, and gingival, and tongue, but light treatment can also be applied inside the subject in order to treat, e.g., the lungs, blood vessels, heart, breast, and other organs of the subject.

These diseases and/or conditions include, e.g., skin diseases, and skin-related conditions including skin-ageing, and cellulite, enlarged pores, oily skin, folliculitis, precancerous solar keratosis, skin lesion, wrinkled and sun-damaged skin, crow's feet, skin ulcers (diabetic, pressure, venous stasis), acne rosacea lesions, cellulite; photomodulation of sebaceous oil glands and the surrounding tissues; reducing wrinkles, acne scars and acne bacteria, inflammation, pain, wounds, psychological and neurological related diseases and conditions, edema, Pagets disease, primary and metastatic tumors, connective tissue disease, manipulation of collagen, fibroblast, and fibroblast derived cell levels in mammalian tissue, illuminating retina, neoplastic, neovascular and hypertrophic diseases, inflammation and allergic reactions, perspiration, sweating and hyperhydrosis from eccrine (sweat) or apocrine glands, jaundice, vitiligo, ocular neovascular diseases, bulimia nervosa, herpes, seasonal affective disorders, mood, sleep disorders, skin cancer, crigler naijar, atopic dermatitis, diabetic skin ulcers, pressure ulcers, bladder infections, relief of muscular pains, pain, stiffness of joints, reduction of bacteria, disinfection, disinfection of liquids, disinfection of beverages such as water, disinfection of nutrition, gingivitis, whitening teeth, treatment of teeth and tissue in mouth, wound healing.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the embodiments, are inventive in their own right and not just as part of an embodiment of the present invention. Independent protection may be sought for these features in addition to or alternative to any invention presently claimed.

The teaching as disclosed here can be abstracted und combined with other examples disclosed.

Figure 1:
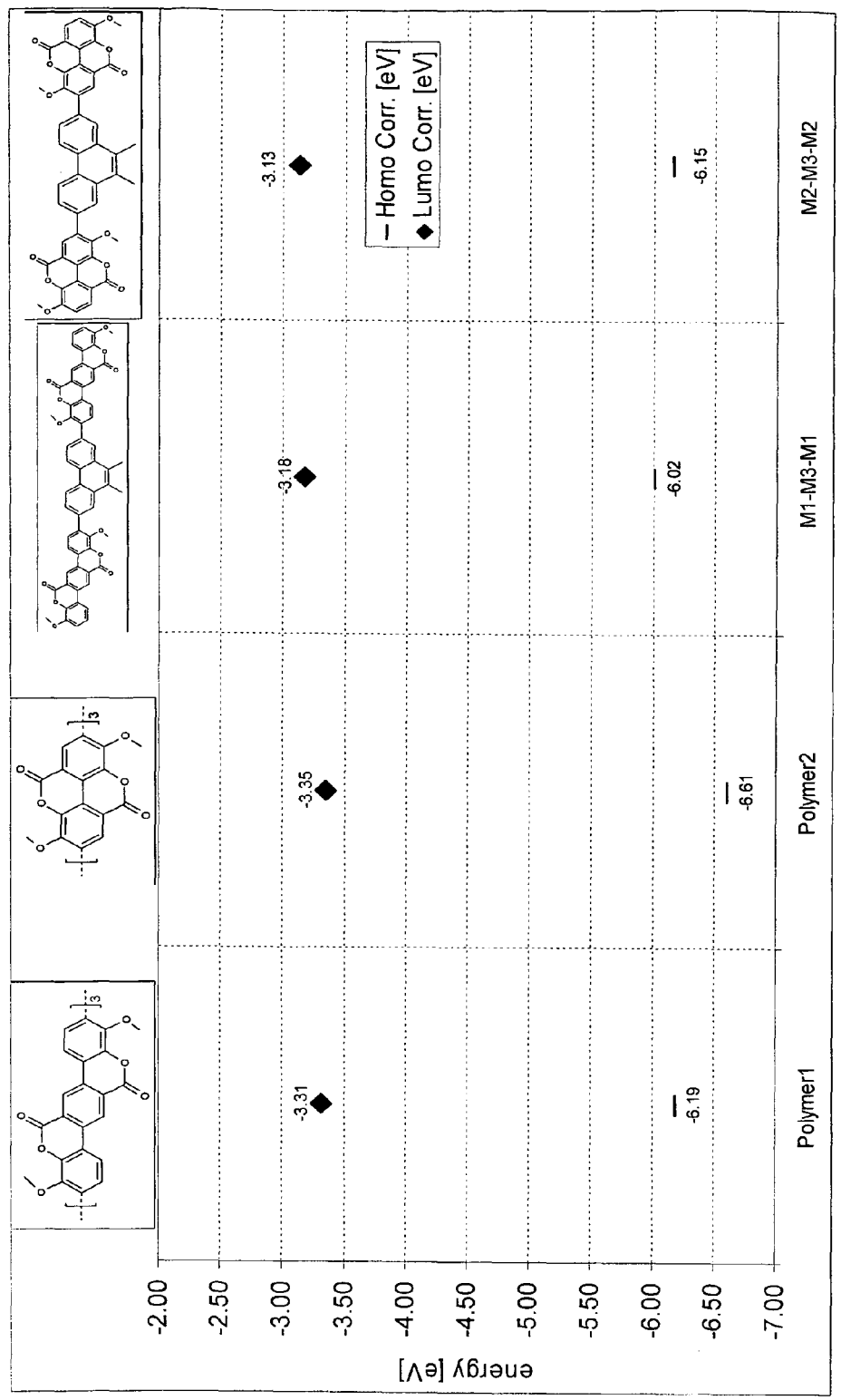
FIG. 1 shows HOMO and LUMO of polymers according to working examples.

Other features of the invention will become apparent in the course of the following description of exemplary embodiments, which are given for illustration of the invention and are not intended to be limiting thereof. Some of the above mentioned embodiments will be described in more detail in the following working examples with reference to the accompanying following drawings in which:

FIG. 1 shows HOMO and LUMO of polymers according to working examples; and

Figure 2:
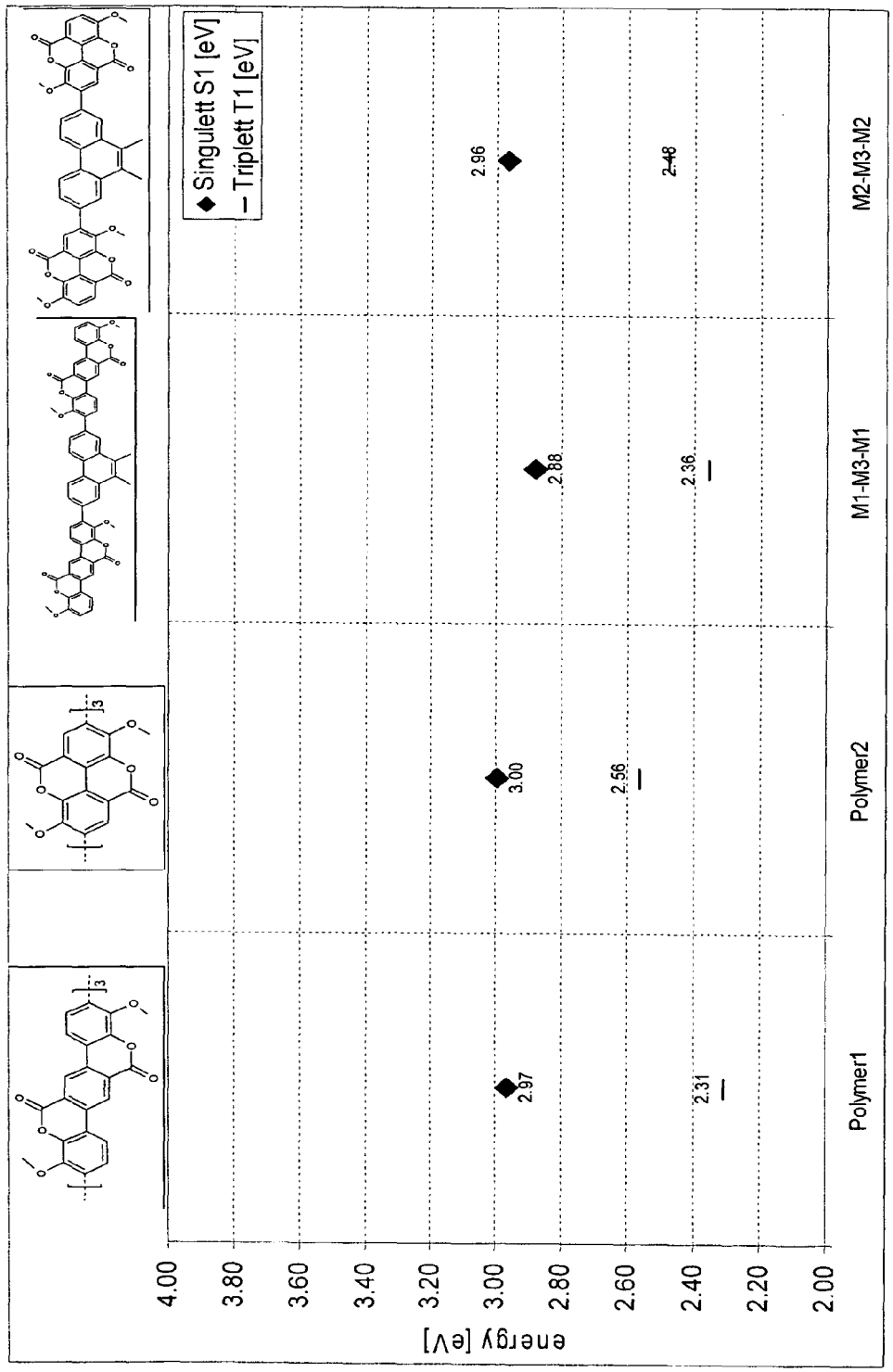
FIG. 2 shows singlet and triplet levels of the polymers according to the working examples of FIG. 1.

FIG. 2 shows singlet and triplet levels of the polymers according to the working examples of FIG. 1.

FIG. 3 Valence and conduction band edges of the common inorganic semiconductors in comparison with two organic semiconductors (P3HT and $C_{60}$).

WORKING EXAMPLES

Example 1

Materials

The following materials will be used in the present invention as examples.

Host material polymer 1 (homo-polymer):

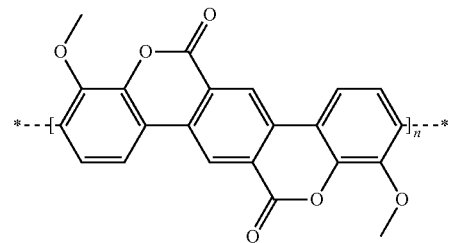

For more information on polymer reference is made to WO2007085377A2. For a detailed synthesis of polymer 1, reference is made to Tetrahedron Letters 47 (2006) 8689-8692.

Quantum dot 1 (QD1) is a core-shell type quantum-dot by Plasmachem GmbH, Berlin, Germany, having a CdSe spheric core capped with epitaxial ZnS shell. QD1 have a surface hydrophobic layer including mostly trioctylphosphine oxide. The photoluminescent quantum efficiency (PLQE) of QD1 is measured using Rhodamine 6G as reference and is found to be about 30%.

TMM, as disclosed by Chen et al. (J. materials Chemistry, 2009, 19, 8112-8118), is a triplet matrix material having a wide band gap, e.g. HOMO of −6.47 eV and LUMO of −2.8 eV according to time dependent DFT method, as described above.

TMM:

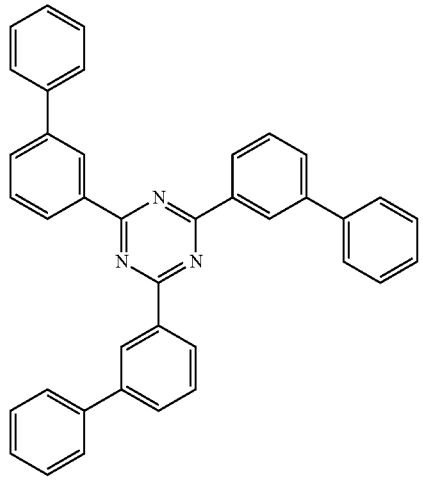 [SMILES: c1ccc(-c2cccc(-c3nc(-c4cccc(-c5ccccc5)c4)nc(-c4cccc(-c5ccccc5)c4)n3)c2)cc1]

Here TMM will be used as electron transport material, or buffer layer between EML and cathode.

Example 2

Energy Levels of the Materials Used in the Present Invention and Some Other Materials Suitable for the QD-LED According to the Present Invention In order to design a material for use in opto-electronic device, the forecast of the energy levels, especially HOMO & LUMO levels are essential.

The energy levels, especially HOMO and LUMO of the molecules of interest are simulated by time dependent DFT in Gaussian 03W by Gaussian, Inc.: at first AM1 was used to optimise the molecular geometry, and TD-DFT (time-dependent density function theory) with correction functional B3PW9 and basis set 6-31G(d) was used for energy calculations, which includes HOMO/LUMO levels and energies for triplet and singlet excited states. The first triplet and first singlet excited states are the most important, and will be called T1 and S1 levels thereafter. The HOMO and LUMO levels are corrected by cyclovoltammetry (CV) as follows: a set of materials are measured by CV and also calculated by the Gaussian 03W with the same method, e.g. using B3PW91 and the same basis set 6-31G(d). The calculated values are then calibrated according to the measured values. Such calibration factor is used for further calculation. For polymers, the trimers of the polymer were calculated. For example, M2-M3-M2 means a structure block as follows; the polymisable groups are removed.

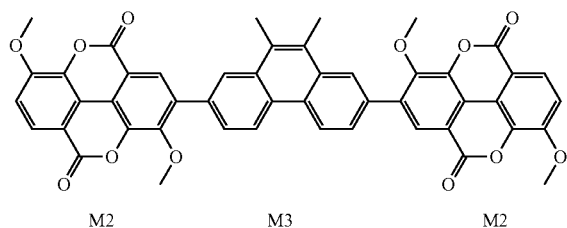 [SMILES: COc1ccc2c(=O)oc3c(OC)c(-c4ccc5c(c4)c(C)c(C)c4cc(-c6cc7c(=O)oc8c(OC)ccc9c(=O)oc(c6OC)c7c89)ccc45)cc4c(=O)oc1c2c34 ; "M2" ; "M3" ; "M2"]

The simulation is done on the polymers based on following 3 different repeating units:

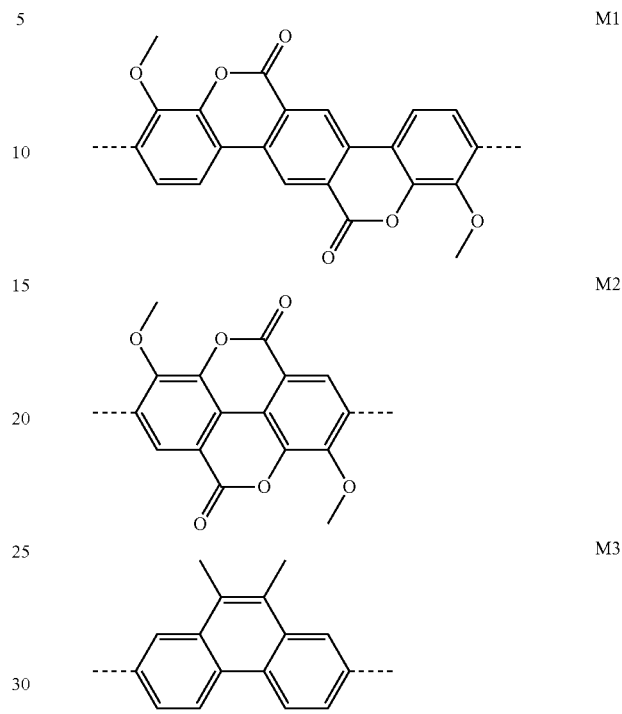

Homopolymers Polymer 1 (100% M1) according to WO2007085377A2 and Polymer 2 (100% M2) according to WO 03/099901, and copolymers of 50% M1-50% M3, and 50% M2-50% M3 were simulated in trimer configurations. FIG. 1 shows the HOMO and LUMO of the polymers (the subscription "Corr." means a corrected value). All have a LUMO lower than −3.0 eV and HOMO lower than −6.0 eV, thus should be suitable to use in the QD-LED according to the present invention. FIG. 2 shows the singlet and triplet levels of the four polymers. All polymers have a high enough S1 level (>2.85 eV), thus are able to support all RGB emission.

Example 3

QD-LED Preparation from Solution

QD-LED with the structure as shown in FIG. 1, is prepared according to the following procedure:

1) Depositing 10 nm $WO_3$ as HIL onto ITO coated glass substrate by thermal evaporation in a vacuum system at a base pressure of $1\times10^{-7}$ mbar.

2) Deposition of the EML from a toluene solution of polymer 1 and QD1, wherein the concentration of QD1 is about 10 wt %, with a thickness of 80 nm using doctor blade technique (dip-coating may also be used here);

3) Heating the device to remove the residual solvent at 180° C. for 10 minutes;

4) Depositing 30 nm TMM as ETL (or buffer layer) by thermal evaporation in a vacuum system at a base pressure of $1\times10^{-7}$ mbar.

5) Depositing by vacuum thermal evaporation over the emissive layer a cathode LiF/Al of 1 nm/150 nm in thickness.

6) Encapsulation of the device.

Example 4

Measurements and Results Comparison

QD-LED was characterized in house, and the following properties were recorded: VIL characteristics, EL spectrum and color coordinates, efficiency, driving voltages.

The performance of QD-LED is summarized in the Table 1, wherein Uon stands for turn-on voltage, U(100) for the voltage at 100 nits, and EQE for external quantum efficiency.

TABLE 1

| Device | Max. Eff. [cd/A] | Uon [V] | U(100) [V] | CIE @ 100 cd/m$^2$ | Max. EQE |
|---|---|---|---|---|---|
| QD-LED | 1.5 | 2.7 | 3.8 | 0.67/0.33 | 1.02% |

A deep red with a CIE coordinate of (0.67, 0.33) was realised. The maximum EQE more than 1% is achieved with combination of a suitable polymer host and a device structure. Though QD-LED is still poorer compared to OLEDs, its performance is already among the best ones reported so far for quantum dot light emitting diodes, indicating that the composition of the EML and the device structure according to the present invention is promising approach to high efficiency QD-LED.

Further improvement could be expected by 1) concentration optimisation; 2) thickness optimisation, 3) using QD with higher photoluminescence (PL) efficiency.

Example 5

Preparation of 9-Phenyl-3-(4,4,5,5-tetramethyl-[1,3,2]dioxaborolan-2-yl)-9H-carbazole

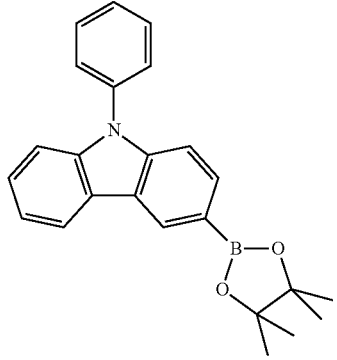 [SMILES: CC1(C)OB(c2ccc3c(c2)c2ccccc2n3-c2ccccc2)OC1(C)C]

150 g (0.41 mol) 3-Iodo-9-phenyl-9H-carbazol, 123.8 g (0.49 mol) 4,4,5,5,4',4',5',5'-Octamethyl-[2,2']bi[[1,3,2]dioxaborolanyl] and 131 g (1.34 mol) Potassium acetate are dissolved in dioxane. Then 3,3 g 1,1-bis(diphenylphosphino)ferrocendichloro-Pd(II) (Pd(dppf)) complex are added to the reaction mixture and the solution is refluxed for 16 h. The mixture is cooled to room temperature and 250 ml water and 250 ml toluene are added and the layers are then separated. The water phase are extracted three times with toluene, and then the organic layers are washed twice with water dried over magnesium sulphate, filtrated and the solvent is removed in the vacuum. The residue is recrystallized from acetonitrile, to yield 91 g (0.25 mmol) (61%) of a light brown solid with a purity of 96%.

Example 6

Preparation of 3-(4-Iodo-phenyl)-9-phenyl-9H-carbazole

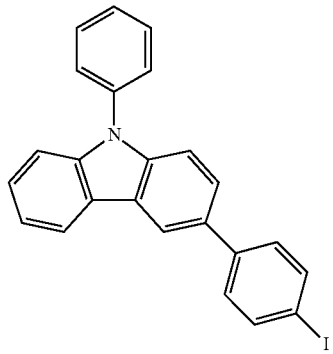 [SMILES: Ic1ccc(-c2ccc3c(c2)c2ccccc2n3-c2ccccc2)cc1]

90 g (244 mmol) 9-Phenyl-3-(4,4,5,5-tetramethyl-[1,3,2]dioxaborolan-2-yl)-9H-carbazole and 69 g (244 mmol) 1-Iodo-4-Brombenzene [589-87-7] are dissolved in 500 ml toluene treated with 200 ml of a 2 M solution of sodium carbonate. The reaction mixture is carefully degassed and 200 mg tetrakistriphenylphosphine palladiume are added. The reaction is heated to reflux for 20 h. The solution is then cooled to room temperature and the layers are separated. The water phase is extracted three times with toluene, and then the organic layers is washed twice with water dried over magnesium sulphate, filtrated and the solvent is removed in the vacuum. The residue is recrystallized from DMF, to yield 100 g (225 mmol) (92%) of a with powder with a purity of 98.7%.

Example 7

Preparation of (9,9-Dimethyl-9H-fluoren-2-yl)-[4-(9-phenyl-9H-carbazol-3-yl)-phenyl]-amine

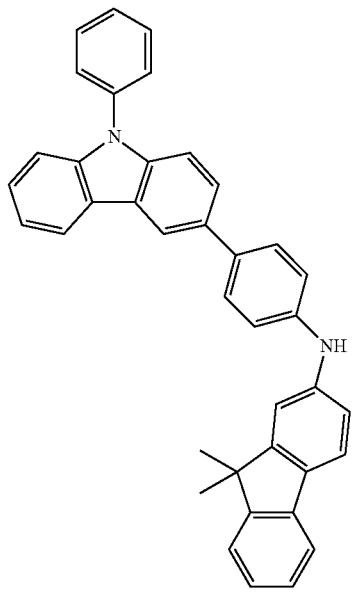 [SMILES: CC1(C)c2ccccc2-c2ccc(Nc3ccc(-c4ccc5c(c4)c4ccccc4n5-c4ccccc4)cc3)cc21]

50 g (112 mmol) 3-(4-Iodo-phenyl)-9-phenyl-9H-carbazole and 23.5 g (112 mmol) 9,9-Dimethyl-9H-fluoren-2-ylamine are dissolved in 500 ml toluene and 21.5 g sodium-tert-butylat is added. The reaction mixture is carefully degassed and 80 mg bis(diphenylphosphino)ferrocendichloro-Pd(II) (Pd(dppf)) complex is added. The solution is refluxed for 6 h. The reaction mixture is then cooled to room temperature and 250 ml water are added. The layers are separated. The water phase is extracted three times with toluene, and then the organic layers is washed twice with water dried over magnesium sulphate, filtrated and the solvent is removed under vacuum. The residue is recrystallized from butanole, to yield 57 g (108 mmol) (96%) of a white solid with a purity of 99.5%.

Example 8

Preparation of (4'-bromo-biphenyl-4-yl)-(9,9-dimethyl-9H-fluoren-2-yl)-[4-(9-phenyl-9H-carbazol-3-yl)-phenyl]-amine

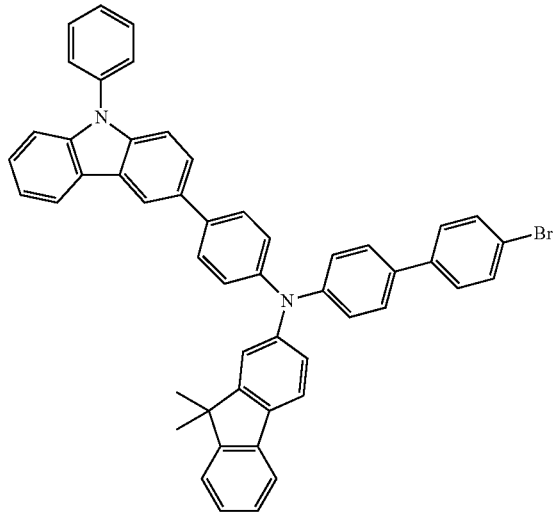 [SMILES: CC1(C)c2ccccc2-c2ccc(N(c3ccc(-c4ccc(Br)cc4)cc3)c3ccc(-c4ccc5c(c4)c4ccccc4n5-c4ccccc4)cc3)cc21]

30 g (57 mmol) (9,9-dimethyl-9H-fluoren-2-yl)-[4-(9-phenyl-9H-carbazol-3-yl)-phenyl]-amine and 20 g (57 mmol) 4-bromo-4'-iodo-biphenyl [105946-82-5] are dissolved in 200 ml toluene and treated with 100 ml of a 2 M solution of sodium carbonate. The reaction mixture is carefully degassed and 200 mg tetrakistriphenylphosphine palladiume are added and refluxed for 20 h. The reaction mixture is then cooled to room temperature and 250 ml water is added. The layers are separated. The water phase is then extracted three times with toluene. The organic layers are then washed twice with water, dried over magnesium sulphate, filtrated and the solvent is then removed under vacuum. The residue is recrystallized from butanole/toluene, to yield 29 g (38 mmol) (67%) of a white solid with a purity of 99.3%.

Example 9

Preparation of 10-(4'-{(9,9-dimethyl-9H-fluoren-2-yl)-[4-(9-phenyl-9H-carbazol-3-yl)-phenyl]-amino}-biphenyl-4-yl)-decane-1-thiol

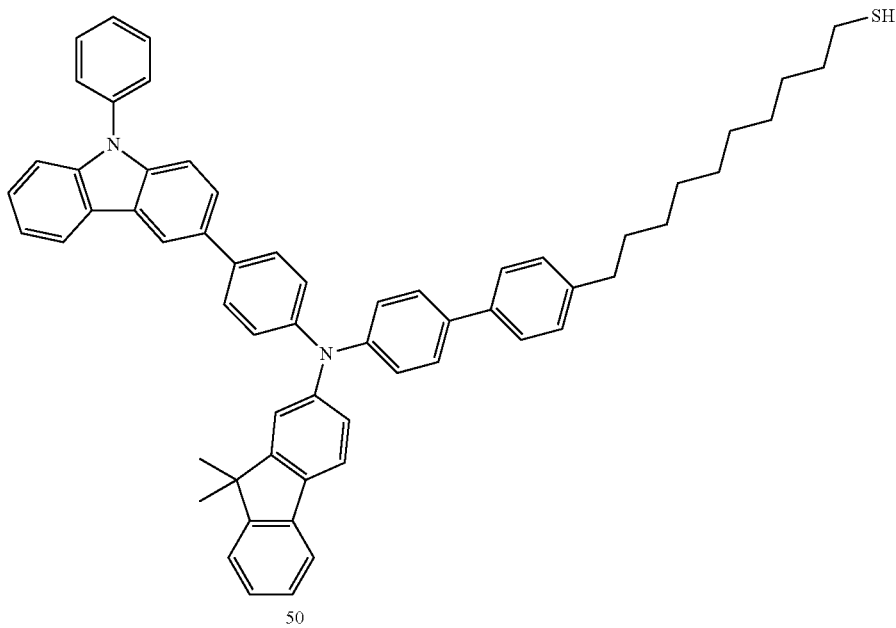

5.2 g (30 mmol) dec-9-ene-1-thiol[178561-30-3] and 3.7 g (15 mmol) 9-BBN-dimer [21205-91-4] are suspended in 100 ml toluene under nitrogene at room temperature and stirred for 20 h. During the reaction the suspension of 9-BBN slowly disappears. Then 23 g (30 mmol) (4'-bromo-biphenyl-4-yl)-(9,9-dimethyl-9H-fluoren-2-yl)-[4-(9-phenyl-9H-carbazol-3-yl)-phenyl]-amine and 50 ml of a 1 M sodium hydroxide solution is added. The reaction mixture is then carefully degassed and 200 mg tetrakistriphenylphosphine palladiume is added and refluxed for 20 h. The reaction mixture is cooled to room temperature and 250 ml water is added. The layers are separated. The water phase is extracted three times with toluene, and then the organic layers is washed twice with water, dried over magnesium sulphate, filtrated and the solvent is removed under vacuum. The residue is recrystallized from ethanole/toluene 3:1, to yield 24 g (28 mmol) (93%) of a white solid with a purity of 99.99%.

The invention claimed is:

1. An electronic device comprising a cathode, an anode, an emissive layer, and a hole injection layer or charge generation layer deposited between the anode and the emissive layer, wherein the emissive layer comprises at least one quantum dot and at least one organic host material and wherein the ionization potential or the valence band (VB) of the quantum dot is at least 0.3 eV higher than the HOMO of the organic host, and wherein the host material is at least one element selected from a host material having a bigger band gap than the quantum dot, an organic compound having a HOMO at least lower than −5.7 eV, and an organic compound having a LUMO at least lower than −3.0 eV and the host material is a polymer comprising at least one repeating unit of the formula (1), (2), (3) or (4)

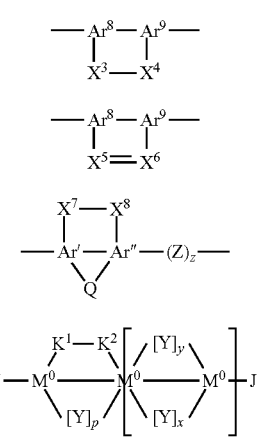

wherein $Ar^8$ and $Ar^9$ independently of each other denote a trivalent aromatic hydrocarbon group or a trivalent heterocyclic group, $X^3$ and $X^4$ independently of each other denote O, S, C(=O), S(=O), $SO_2$, $C(R^1)(R^2)$, $Si(R^1)(R^2)$, $N(R^1)$, $B(R^1)$, $P(R^1)$ or $P(=O)(R^1)$, $X^5$ and $X^6$ independently of each other denote N, B, P, $C(R^1)$ or $Si(R^1)$, $R^1$ and $R^2$ are independently of each other identical or different groups selected from H, halogen, —CN, —NC, —NCO, —NCS, —OCN,
—SCN, —C(=O)$NR^0R^{00}$, —C(=O)X, —C(=O)$R^0$, —$NH_2$, —$NR^0R^{00}$,
—SH, —$SR^0$, —$SO_3H$, —$SO_2R^0$, —OH, —$NO_2$, —$CF_3$, —$SF_5$, optionally substituted silyl, or carbyl or hydrocarbyl with 1 to 40 C atoms that is optionally substituted and optionally includes one or more hetero atoms, and optionally the groups $R^1$ and $R^2$ form a spiro group with the fluorene moiety to which they are attached, X is halogen, $R^0$ and $R^{00}$ are independently of each other H or an optionally substituted carbyl or hydrocarbyl group optionally including one or more hetero atoms, $X^3$ and $Ar^9$ are bonded to adjacent carbon atoms in the aromatic ring of $Ar^9$, $X^4$ and $Ar^8$ are bonded to adjacent carbon atoms in the aromatic ring of $Ar^9$, $X^5$ and $Ar^9$ are bonded to adjacent atoms in the aromatic ring of $Ar^8$, and $X^6$ and $Ar^8$ are bonded to adjacent atoms in the aromatic ring of $Ar^9$, Ar' and Ar" denote an aromatic hydrocarbon group or heterocyclic group;

one of $X^7$ and $X^8$ denotes C(=O) or $C(R^1)(R^2)$ and the other denotes O, S, C(=O), S(=O), $SO_2$, $C(R^1)(R^2)$, $Si(R^1)(R^2)$, $N(R^1)$, $B(R^1)$, $P(R^1)$ or $P(=O)(R^1)$, Q is $X^9$, $X^9$—$X^{10}$ or $X^{11}$=$X^{12}$, $X^9$ and $X^{10}$ denote independently of each other O, S, C(=O), S(=O), $SO_2$, $C(R^1)(R^2)$, $Si(R^1)(R^2)$, $N(R^1)$, $B(R^1)$, $P(R^1)$ or $P(=O)(R^1)$, $X^{11}$ and $X^{12}$ denote independently of each other N, B, P, $C(R^1)$ or $Si(R^1)$, Z denotes —$CR^1$=$CR^2$— or —C≡C—, z is 0 or 1, $R^1$ is as defined above, $R^2$ is as defined above, $M^0$ is in case of multiple occurrence independently of one another an aromatic, heteroaromatic or non-aromatic ring system having 2 to 40 C atoms, which is unsubstituted or substituted with one or more identical or different groups $R^1$, $K^1$, $K^2$ and Y are in case of multiple occurrence independently of one another a bridging group forming a cyclic system with M, selected from $B(R^1)$, $C(R^1)_2$, $Si(R^1)_2$, C=O, C=S, C=Se, C=Te, C=$NR^1$, C=$C(R^1)_2$, O, S, S=O, $SO_2$, $S(R^1)_2$, $N(R^1)$, $P(R^1)$, P(=O)$R^1$, P(=S)$R^1$, C≡C or a combination or one, two, three or four of these groups, J is a linkage group to the polymer, and may also be a substituted or unsubstituted C—C-double or triple bond, a substituted aromatic or heteroaromatic or non-aromatic cyclic ring system having 2 to 40 C atoms, which is unsubstituted or substituted with one or more identical or different groups $R^1$, $R^1$ is as defined above, x, y and p are in case of multiple occurrence independently of one another 0 or 1, with the proviso that at least one of x and y is 1, q is an integer ≥1.

2. The electronic device according to claim 1, wherein the charge generation layer or hole injection layer has a working function or electron affinity higher than 5.6 eV, and/or wherein the hole injection layer or charge generation layer comprises at least one element selected from a transition metal oxide, vanadium oxide ($VO_x$), molybdenum oxide ($MoO_x$), ruthenium oxide ($RuO_x$) and tungsten oxide ($WO_x$).

3. The electronic device according claim 1, wherein the or the electron affinity or conduction band of the quantum dot is at least 0.3 eV lower than the LUMO of the host material.

4. The electronic device according claim 1, wherein the ionisation potential or the valence band (VB) of the quantum dot is at least 0.5 eV higher than the HOMO of the organic host, or the electron affinity or conduction band of the quantum dot is at least 0.5 eV lower than the LUMO of the host material.

5. The electronic device according to claim 1, wherein the quantum dot has a valence band higher than −5.7 eV.

6. The electronic device according to claim 1, wherein quantum dot comprises at least one element selected from Group II-VI, Group III-V, Group IV-VI and Group IV semiconductors.

7. The electronic device according to claim 1, wherein the quantum dot comprises ZnO, ZnS, ZnSe, ZnTe, CdS, CdSe, CdTe, HgS, HgSe, HgTe, MgS, MgSe, GeS, GeSe, GeTe, SnS, SnSe, SnTe, PbO, PbS, PbSe, PbTe, GaN, GaP, GaAs, GaSb, InN, InP, InAs, InSb, AlN, AlP, AlAs, AlSb, GaN, GaP, GaAs, GaSb, or a combination of two or more such semiconductors, and/or with core/shell, core multi-shell layered-structures thereof.

8. The electronic device according to claim 1, wherein the concentration of the quantum dot is chosen such that the quantum dot works as hole trap or electron trap in the organic host, and is from 0.5 to 20 vol %.

9. The electronic device according to claim 1, comprising
at least one further organic emitter, or
at least one further organic emitter having an absorption spectrum overlapping with an emission spectrum of the quantum dot.

10. The electronic device according to claim 1, wherein the device is selected from a light emitting device, a light converting device, a light harvesting device, a photovoltaic device, a photo-diode, a light sensor device, an organic light emitting diode (OLED), a polymer light emitting diode (PLED), an organic light emitting electrochemical cell, an organic field effect transistor (OFET), a thin film transistor (TFT), an organic solar cell (O-SC), an organic laser diode (O-laser), an organic integrated circuit (O-IC), a radio frequency identification (RFID) tag, a photodetector, a sensor, a logic circuit, a memory element, a capacitor, a charge injection layer, a Schottky diode, a planarising layer, an antistatic film, a conducting substrate or pattern, a photoconductor, an electrophotographic element, an organic light emitting transistor (OLET), an organic spintronic device, and an organic plasmon emitting device (OPEDs).

11. The electronic device according claim 1, wherein the ionisation potential or the valence band (VB) of the quantum dot is at least 0.4 eV higher than the HOMO of the organic host.

12. The electronic device according to claim 1, wherein the host material is a polymer comprising at least one repeating unit of the formula

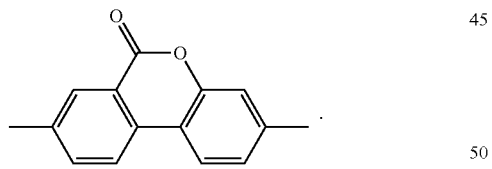

13. The electronic device according to claim 1, wherein the host material is a polymer comprising at least one repeating unit of the formula

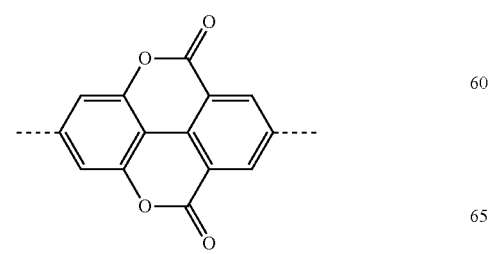

-continued

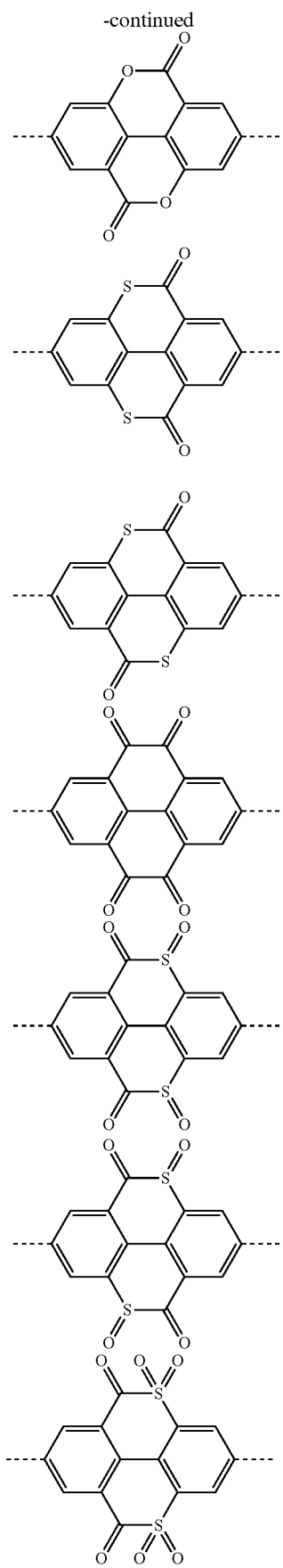

14. The electronic device according claim 1, wherein the host material is a polymer comprising at least one repeating unit of the formula (4) which is selected from the following formula
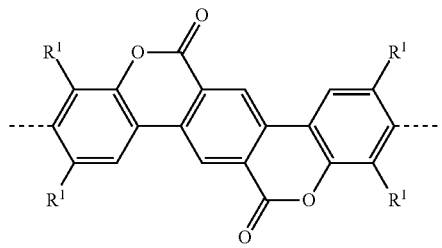
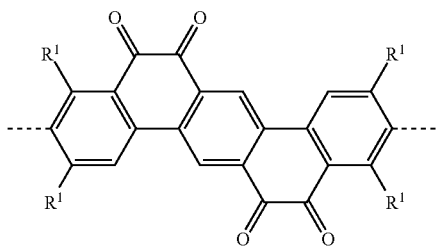
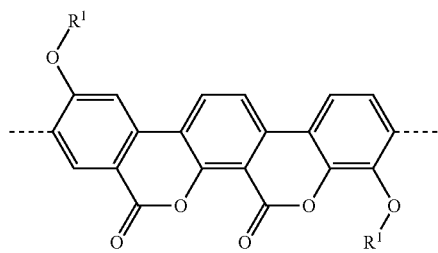
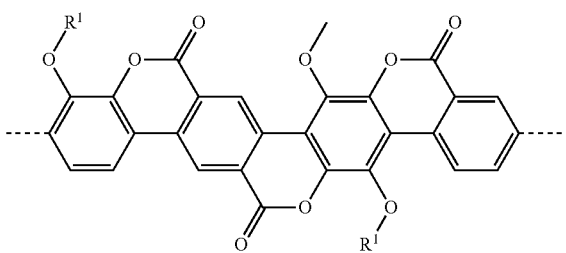
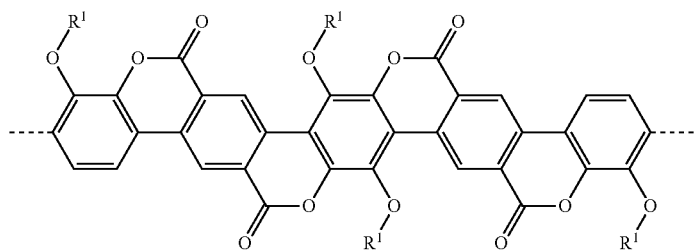
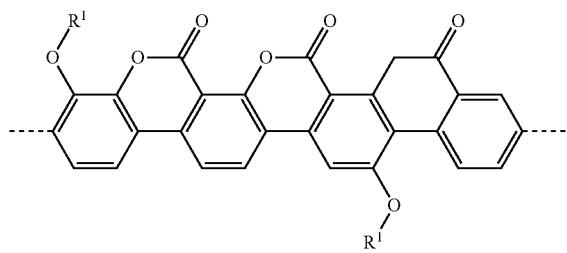
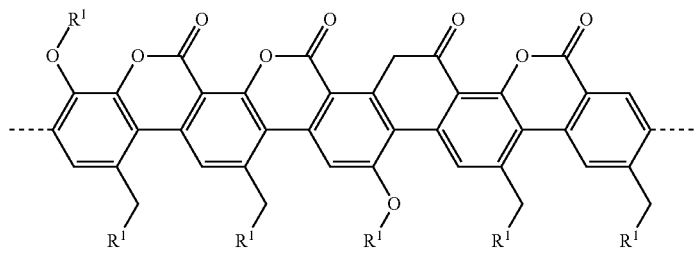
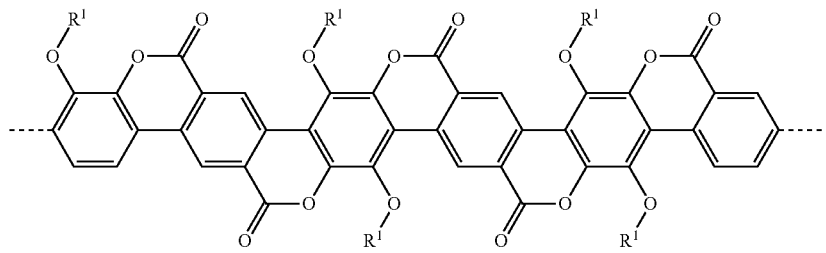

-continued

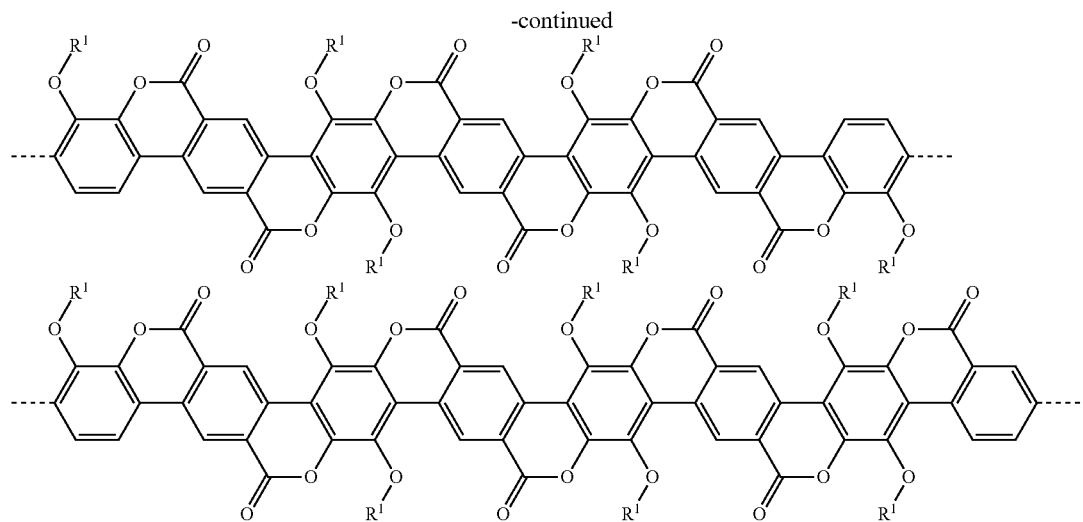

15. The electronic device according claim 1, wherein the concentration of the quantum dot is from 5 to 15% wt %.

16. A mixture comprising at least one quantum dot and one organic host, wherein the ionisation potential or the valence band of the quantum dot is at least 0.3 eV higher than the HOMO of the organic host and the organic host material is a polymer comprising at least one repeating unit of the formula (1), (2), (3) or (4)

$$—Ar^8—Ar^9—$$
$$\quad\ |\quad\quad\ |$$
$$\ \ X^3—X^4 \quad \text{formula (1)}$$

$$—Ar^8—Ar^9—$$
$$\quad\ |\quad\quad\ |$$
$$\ \ X^5=X^6 \quad \text{formula (2)}$$

$$\begin{array}{c} X^7—X^8 \\ \diagup \quad\ \ \diagdown \\ —Ar'—Ar''—(Z)_z— \\ \diagdown \quad\ \ \diagup \\ Q \end{array} \quad \text{formula (3)}$$

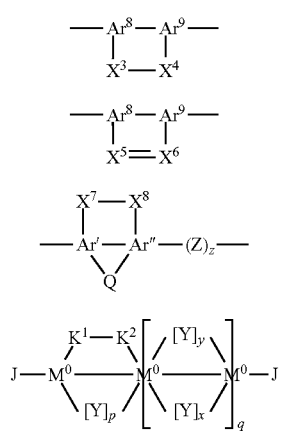

formula (4)

wherein
Ar$^8$ and Ar$^9$ independently of each other denote a trivalent aromatic hydrocarbon group or a trivalent heterocyclic group,
X$^3$ and X$^4$ independently of each other denote O, S, C(=O), S(=O), SO$_2$, C(R$^1$)(R$^2$), Si(R$^1$)(R$^2$), N(R$^1$), B(R$^1$), P(R$^1$) or P(=O)(R$^1$),
X$^5$ and X$^6$ independently of each other denote N, B, P, C(R$^1$) or Si(R$^1$),
R$^1$ and R$^2$ are independently of each other identical or different groups selected from H, halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally includes one or more hetero atoms, and optionally the groups R$^1$ and R$^2$ form a spiro group with the fluorene moiety to which they are attached, X is halogen,
R$^0$ and R$^{00}$ are independently of each other H or an optionally substituted carbyl or hydrocarbyl group optionally including one or more hetero atoms,
and wherein
X$^3$ and Ar$^9$ are bonded to adjacent carbon atoms in the aromatic ring of Ar$^9$,
X$^4$ and Ar$^8$ are bonded to adjacent carbon atoms in the aromatic ring of Ar$^9$,
X$^5$ and Ar$^9$ are bonded to adjacent atoms in the aromatic ring of Ar$^8$, and
X$^6$ and Ar$^8$ are bonded to adjacent atoms in the aromatic ring of Ar$^9$,
Ar' and Ar'' denote an aromatic hydrocarbon group or heterocyclic group;
one of X$^7$ and X$^8$ denotes C(=O) or C(R$^1$)(R$^2$) and the other denotes O, S, C(=O), S(=O), SO$_2$, C(R$^1$)(R$^2$), Si(R$^1$)(R$^2$), N(R$^1$), B(R$^1$), P(R$^1$) or P(=O)(R$^1$),
Q is X$^9$, X$^9$—X$^{10}$ or X$^{11}$=X$^{12}$,
X$^9$ and X$^{10}$ denote independently of each other O, S, C(=O), S(=O), SO$_2$, C(R$^1$)(R$^2$), Si(R$^1$)(R$^2$), N(R$^1$), B(R$^1$), P(R$^1$) or P(=O)(R$^1$),
X$^{11}$ and X$^{12}$ denote independently of each other N, B, P, C(R$^1$) or Si(R$^1$),
Z denotes —CR$^1$=CR$^2$— or —C≡C—,
z is 0 or 1,
R$^1$ is as defined above,
R$^2$ is as defined above,
M$^0$ is in case of multiple occurrence independently of one another an aromatic, heteroaromatic or non-aromatic ring system having 2 to 40 C atoms, which is unsubstituted or substituted with one or more identical or different groups R$^1$,
K$^1$, K$^2$ and Y are in case of multiple occurrence independently of one another a bridging group forming a cyclic system with M, selected from B(R$^1$), C(R$^1$)$_2$, Si(R$^1$)$_2$, C=O, C=S, C=Se, C=Te, C=NR$^1$, C=C(R$^1$)$_2$, O, S, S=O, SO$_2$, S(R$^1$)$_2$, N(R$^1$), P(R$^1$), P(=O)R$^1$, P(=S) R$^1$, C≡C or a combination or one, two, three or four of these groups, J is a linkage group to the polymer, and may also be a substituted or unsubstituted C—C-double or triple bond, a substituted aromatic or heteroaromatic or non-aromatic cyclic ring system having 2 to 40 C atoms, which is unsubstituted or substituted with one or more identical or different groups $R^1$, $R^1$ is as defined above, x, y and p are in case of multiple occurrence independently of one another 0 or 1, with the proviso that at least one of x and y is 1, q is an integer $\geq 1$.

17. The mixture according to claim 16, wherein the organic host has a bigger band gap than the quantum dot.

18. The mixture according to claim 16, wherein the quantum dot has a valence band (VB) higher than higher than −5.7 eV and/or wherein the quantum dot comprises at least one element selected from group consisting of ZnO, ZnS, ZnSe, ZnTe, CdS, CdSe, CdTe, HgS, HgSe, HgTe, MgS, MgSe, GeS, GeSe, GeTe, SnS, SnSe, SnTe, PbO, PbS, PbSe, PbTe, GaN, GaP, GaAs, GaSb, InN, InP, InAs, InSb, AlN, AlP, AlAs, AlSb, GaN, GaP, GaAs, GaSb, and a combination of two or more such semiconductors, and/or with core/shell, core multi-shell layered-structures thereof.

19. The mixture according to claim 16, wherein the concentration of the quantum dot is chosen such that it works as hole trap in the organic host and is from 0.5 to 30 wt %.

20. The mixture according to claim 16, comprising at least one further emitter, or at least one further emitter having an absorption spectrum overlapping with an emission spectrum of the quantum dot, and/or wherein the at least one further emitter is an organic compound or other quantum dot.

21. An electronic device comprising the mixture according to claim 16 or comprising an anode, a cathode and a functional layer in-between the anode and the cathode, wherein the functional layer comprises the mixture according to claim 16.

22. A formulation comprising the mixture according to claim 16.

* * * * *